United States Patent [19]

Chiba et al.

[11] Patent Number: 5,251,330
[45] Date of Patent: Oct. 5, 1993

[54] LINEAR TRANSMITTER

[75] Inventors: Kouji Chiba; Toshio Nojima; Yasushi Yamao, all of Yokosuka; Shigeru Tomisato, Yokohama; Tadao Takami, Yokosuka, all of Japan

[73] Assignee: Nippon Telegraph & Telephone Corporation, Tokyo, Japan

[21] Appl. No.: 651,375

[22] PCT Filed: Jun. 28, 1990

[86] PCT No.: PCT/JP90/00838
§ 371 Date: Apr. 19, 1991
§ 102(e) Date: Apr. 19, 1991

[87] PCT Pub. No.: WO91/00653
PCT Pub. Date: Jan. 10, 1991

[30] Foreign Application Priority Data

Jun. 30, 1989 [JP] Japan .................... 1-68723
Sep. 19, 1989 [JP] Japan .................... 1-242465
Sep. 29, 1989 [JP] Japan .................... 1-254457
Jan. 29, 1990 [JP] Japan .................... 2-18735
Feb. 13, 1990 [JP] Japan .................... 2-33126

[51] Int. Cl.$^5$ .................... H04B 1/02; H04B 1/04
[52] U.S. Cl. .................... 455/91; 455/110; 455/127
[58] Field of Search .................... 455/42, 43, 44, 91, 455/127, 110, 111, 113, 108

[56] References Cited

U.S. PATENT DOCUMENTS 4,053,854 10/1977 Havens .................... 455/91
4,565,980 1/1986 Ashida .................... 455/110
4,805,028 2/1989 Nishioka et al. .................... 358/225

FOREIGN PATENT DOCUMENTS 61-163730 7/1986 Japan .
62-274906 11/1987 Japan .
63-67925 3/1988 Japan .
0222524 10/1991 Japan .................... 455/127

OTHER PUBLICATIONS

M. J. Koch, et al., "A High Efficiency 835 MHz Linear Power Amplifier for Digital Cellular Telephony", IEEE 1989, pp. 17–18.
H. L. Krauss, et al., "CW, FM, and AM Transmitters", Single-Sideband Transmitters; Solid State Radio Engineering, pp. 477–522.

Primary Examiner—Reinhard J. Eisenzopf
Assistant Examiner—Christine K. Belzer
Attorney, Agent, or Firm—Cushman, Darby & Cushman

[57] ABSTRACT

This invention relates to a linear transmitter which controls the bias voltage of either the drain electrode or collector electrode of an amplifier for radio frequency based on the envelope of the modulated signal, and is characterized in that it controls the bias voltage of the radio frequency amplifier in digital arithmetic processing by generating the envelope using in-phase envelope component and quadrature envelope component obtained from the base band signals.

12 Claims, 32 Drawing Sheets spectrum of emvelope signal output characteristic ( no signal conversion )

output characteristic ( signal converted )

LINEAR TRANSMITTER

TECHNICAL FIELD

This invention relates to a transmitter for radio frequency (RF). It relates, more particularly, to a linear transmitter which amplifies and transmits modulated signals which have a widely-varying envelope signal level, at a high power efficiency.

BACKGROUND TECHNOLOGY

Power amplifiers of class A or B have been used as the linear transmitter for radio frequency. But such power amplifier is defective in that the power efficiency remarkably deteriorates in the low level region when it is used to amplify modulated signals which changes drastically in the level of the envelope. In RF transmitters of portable type which use batteries as the power source, for example, such problems arise as duration of transmittable time becomes short or a large and heavy battery becomes necessary.

In order to overcome such problems, the present applicant has filed a patent application for the linear power amplifier of high efficiency (Japanese Patent Application laid-open Sho 62-274906). FIG. 1 shows the construction of an embodiment of the linear transmitter using above-mentioned linear power amplifier.

An input terminal 1 is inputted with signals to be modulated in analog or digital form. A modulator 2 generates linear modulated signals based on the above signals. A high-frequency saturated power amplifier 4 amplifies the linear modulated signals and outputs the same at an output terminal 9.

The power amplifier 4 includes an input matching circuit 41, a FET 42 as an amplification device, an RF choke coil 43 and an output matching circuit 44, and makes the saturated output level of the amplifier 4 correspond to the envelope of the input signals by controlling the drain bias voltage $V_D$ of the FET to be substantially proportional to the envelope of the input signals. This type of control enables the amplifier 4 to operate as a linear amplifier while maintaining it at saturation condition with a high efficiency to remarkably reduce the distortion in outputs.

The drain bias voltage $V_D$ may be obtained by controlling the power voltage inputted at a power supply terminal 8 by a DC voltage controller 7. The DC voltage controller 7 includes a DC-DC converter or a series-pass regulated transistor, and is controlled by drain voltage control signals $V_C$. The control signals $V_C$ are obtained by dividing with a coupler 3 the linear modulated signals fed from the modulation 2 to the amplifier 4, detecting the envelope thereof with an envelope detector 5 and compensating the detector output $V_C'$ using a compensating circuitry 6.

As the above-mentioned prior art uses a saturation type radio frequency power amplifier of high efficiency, theoretically it can conduct linear amplification at a remarkably high efficiency. For instance, if a saturated power amplifier of power efficiency of 70% is used as the amplifier 4 and a DC-DC converter of 75% efficient is used as the circuit 7, the linear amplification may be conducted at combined efficiency of 50% or higher.

FIG. 2 is a block diagram to show an embodiment of the compensate circuitry 6.

An envelope detector 5 includes a RF diode or other parts of non-linear analog circuit, and characteristics of detector thereof change due to changes in temperature. The current temperature is detected by a temperature sensor 64, and the detector output $V_C$ of the detector 5 is compensated based on the temperature by an operational circuitry 62.

The detector output $V_C'$ is digitized by an A/D converter 61 and inputted at an operational circuitry 62. The circuitry 62 reads a compensating value for the diode characteristic which corresponds to the output of the temperature sensor from a memory 65 which stores diode characteristics and compensates the input signals with the compensated values. The result is converted into analog signals by D/A converter 63 and outputted.

However, the prior art linear transmitter fluctuates in its detector characteristics because of temperature changes as well as manufacture errors as the envelope detector comprises RF diode or other parts of non-linear analog circuit. Therefore, the drain control signals are extremely difficult to improve their precision, and errors in drain bias make it difficult to reduce distortion satisfactorily.

This problem may be solved by providing a compensate circuitry, but the construction of such the circuitry inevitably becomes more complicated and expensive.

This invention aims to overcome those problems encountered in the prior art and aims to provide a linear transmitter which can conduct linear power amplification at high efficiency with less distortion but without the necessity to use complicated compensate circuitries.

DISCLOSURE OF THE INVENTION

The linear transmitter according to this invention has a modulation unit comprising a complex envelope generator which generates in-phase envelope signal component and quadrature envelope signal component of modulated signals out of the input signals, a quadrature modulator which generates modulated signals out of the in-phase envelope signal component and quadrature envelope signal component, and an envelope generating means which obtains envelope from both of the envelope components and supplies the same to a bias means.

Instead of obtaining envelopes with an envelope detector having diodes or other analog devices in radio frequency, it obtains envelopes by digital arithmetic processing in the base band. This resolves the problem of characteristic fluctuation which is otherwise caused in analog devices.

Moreover, as drain (or collector) control signals are obtained by digital arithmetic processing, highly stable and precise control signals can be obtained without the necessity of adjustment to attain sufficient effect in distortion reduction. Further, it facilitates construction of LSI circuits.

The envelope generating means may include a numerical arithmetic processor which obtains envelopes from the input in-phase envelope component and quadrature envelope component by digital arithmetic operation. It may separately include a memory table which outputs values that have been written in for the in-phase envelope component and quadrature envelope component.

It is preferable to provide a delay time adjustment means which matches timewise the waveforms of the modulated signals inputted at the radio frequency power amplifier with the waveforms of the bias voltage in order to compensate the time delayed by digital processing.

It may include an frequency equalizer which equalizes the output amplitude and phase of the envelope generating means and supplies them to a bias means. This can enhance the bandwidth of frequency characteristics of the bias means to be sufficient for high modulation frequency.

It may include a minimum bias voltage hold means which maintains the output voltage from the bias means at a prescribed value or higher when the signal level of the envelope outputted from the envelope generating means is smaller than a preset level. This enables the bias voltage of the radio frequency power amplifier to be maintained at a given value or higher when the envelope level of input signals is small and amplification factor at a given level or higher, to thereby reduce distortion in output.

The minimum bias voltage hold means preferably includes a signal converter which supplies signals of a substantially constant value to the bias means when the signal level of the envelope outputted from the envelope generating means is smaller than a preset value, and supplies signals substantially proportional to said signal level when said signal level is larger than the preset value.

It may also include an output detecting means which obtains the envelope of the modulated signals outputted from the radio frequency power amplifier and an envelope compensating means which compensates the signal level of the envelope supplied at the bias means based on the difference between the output from the output detecting means and the output from the envelope generating means. As the power voltage is controlled in advance with the envelope of the input modulated signals to reduce distortion in the output considerably, the closed loop gain in the error signals can be made small and the errors in feedback loop can be made small to thereby enable stable operation of the negative feedback loop.

Separately from the above, it may include an output detecting means which obtains the envelope of modulated signals outputted from the radio frequency power amplifier, and an input controller means which controls the amplitude of the modulated signals inputted at the radio frequency power amplifier based on the difference between the output from the output detecting means and the output from the envelope generating means. In this case, similar to the case where signal level of the envelope is compensated based on the difference, the power voltage is controlled in advance with the reference envelope to considerably reduce distortion, and the closed loop gain of the feedback loop can be reduced more with the envelope of input/output than the case where the power voltage is not controlled at all. Therefore, the feedback loop of the error signals can have frequency characteristics of wider bandwidth to realize sufficient compensation for amplitude distortion.

However, high speed transmission becomes difficult even if the power voltage of the radio frequency power amplifier is controlled as when the signals to be amplified are of high speed, distortion cannot be quite compensated. This is because the frequency characteristics of the DC voltage control circuit which is used as the bias means depend on the switching frequency thereof. The switching frequency remains so far at the level of ca. 1 MHz and the obtained band remains at 20–30 KHz currently. Therefore sufficient voltage control cannot be conducted for modulated signals which change in envelope at a speed higher than above, and hence, larger amplitude distortion cannot be compensated. Compensation of residual distortion is therefore conducted without using the DC voltage control circuit to overcome the problem. In this case, it is not necessary to pay too much attention to the frequency characteristics of the DC voltage control circuit.

In other words, voltage control is conducted to reduce distortion to a certain level and to improve power efficiency while the input signals at the power amplifier are modulated in amplitude with the error signals obtained from the input/output envelope to compensate distortion at high precision. This can remarkably reduce the distortion.

The radio frequency power amplifier includes a cascade solid state amplification device, and further comprises an output detecting means which obtains the envelope of the modulated signals outputted from the final stage of the cascade device and a control means which controls the bias voltage of the device at the first or middle stage based on the difference between the output from the output detecting means and the output from the envelope generating means.

In the case where the output detecting means is used, it is preferable to have a detector characteristic compensating means which compensates the difference in the characteristics between the envelope generating means and the output detecting means. The detector characteristic compensating means preferably includes a means which compensates the output from the envelope generating means by a circuit which has non-linearity substantially the same as the characteristics of the output detecting means.

OPTIMAL MODE TO REALIZE THIS INVENTION

Figure 3:
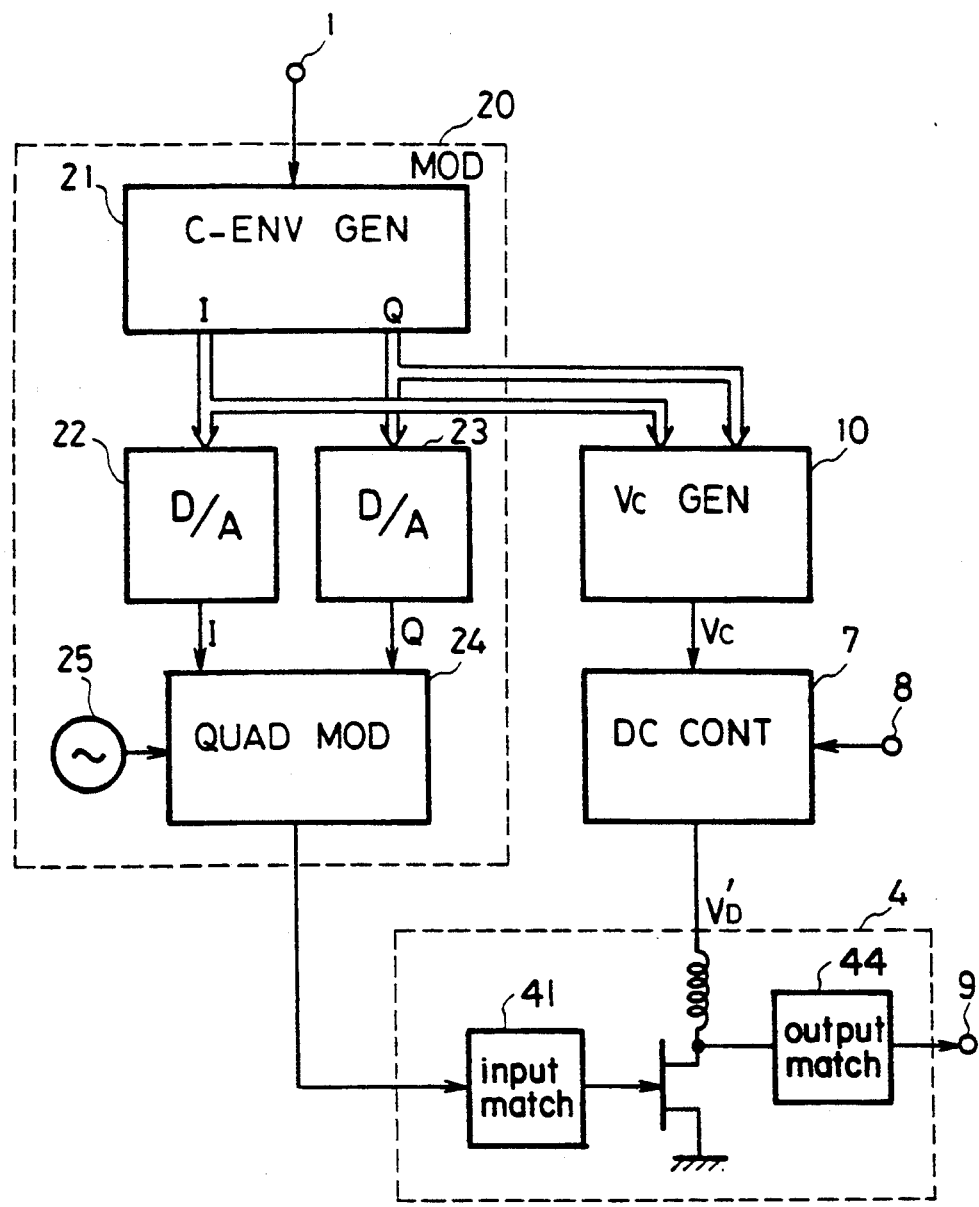
FIG. 3 is a block diagram to show the first embodiment of the linear transmitter according to this invention.

FIG. 3 is a block diagram to show the first embodiment of the linear transmitter according to this invention.

This transmitter comprises a modulation unit 20 which modulates the amplitude of input signals, a high-frequency saturated power amplifier 4 which amplifies the modulated signals outputted from the modulation unit 20 by a FET with a grounded source, and a DC voltage controller circuit 7 which outputs a DC voltage which is substantially proportional to the envelope of the modulated signals as the bias voltage of the power amplifier 4.

This embodiment is characterized by the construction of the modulation unit 20 which includes a complex envelope generator 21 which generates in-phase envelope component and quadrature envelope component out of the input signal, and a quadrature modulator 24 which generates modulated signal based on the in-phase envelope component and the quadrature envelope component, and the unit 20 further comprises a drain voltage controller 10 which obtains an envelope based on the in-phase envelope component and the quadrature envelope component and supplies the same to a DC voltage controller 7.

A base band signal is inputted at an input terminal 1, and supplied to the complex envelope generator 21. The power voltage is inputted at a power supply terminal 8 and supplied to the DC voltage controller 7. A carrier is supplied from a local oscillator 25 to the quadrature modulator 24.

The modulation unit 20 is a circuit which generates modulated signal of which the envelope and the phase change. For example, its use is discussed in the paper titled, Development of QPSK MODEM for Continuously Variable Band Rate by T. Miyo, M. Ono and T. Aono, Preprint of 1988 Electronic Information Communication Association, Paper No. SB-3-2.

The modulated signal e(t) is generally expressed by the equation (1) given the carrier angular frequency $\omega c$ of the modulated signal denoted, the envelope signal R(t) and the modulated phase shift $\phi(t)$.

$$\begin{aligned} e(t) &= R(t)[\exp[j\phi(t)] \exp[j\omega_c t]] \\ &= Re[E(t) \exp[j\omega_c t]] \end{aligned} \quad (1)$$

wherein E(t) denotes the real part of the function f and E(t) denotes a complex envelope, and may be expressed as below.

$$E(t) = I(t) - jQ(t) \quad (2)$$

$$\left.\begin{aligned} I(t) &= R(t) \cos \phi(t) \\ Q(t) &= R(t) \sin \phi(t) \end{aligned}\right\} \quad (3)$$

I(t) and Q(t) are referred to as in-phase envelope component and quadrature envelope component respectively.

The complex envelope generator 21 calculates by digital processing of the values of in-phase envelope component I(t) and of the quadrature envelope component Q(t) corresponding to the input. The calculated values are converted into analog voltages respectively by D/A converters 22, 23 to obtain the waveforms of I(t) and Q(t). Those waveforms are inputted at the quadrature modulator 24. The quadrature modulator 24 multiplies I(t) and Q(t) with the in-phase carrier and quadrature carrier respectively, and adds the products to obtain e(t).

The drain voltage controller 10 obtains the envelope R(t) by the equation (4) using the values I(t) and Q(t) calculated by the complex envelope generator 21.

$$R(t) = [I(t)^2 + Q(t)^2]^{\frac{1}{2}} \quad (4)$$

The envelope R(t) is converted, as it is or after it is compensated so as to have the optimal drain control, by a D/A converter to analog voltage, and inputted at the DC voltage controller 7 as the drain control signal $V_C$.

The DC voltage controller 7 changes the drain bias voltage of the power amplifier 4 in proportion to the drain control signal $V_C$.

In this manner, the modulated signal e(t) outputted from the quadrature modulator 24 is supplied at an input of the power amplifier 4, and the drain voltage is controlled to correspond to the envelope of the modulated signal e(t). As a result, it becomes possible to conduct linear amplification while maintaining saturation condition at a high efficiency, to thereby enable signals with less distortion to be obtained at the output terminal 9.

Figure 4:
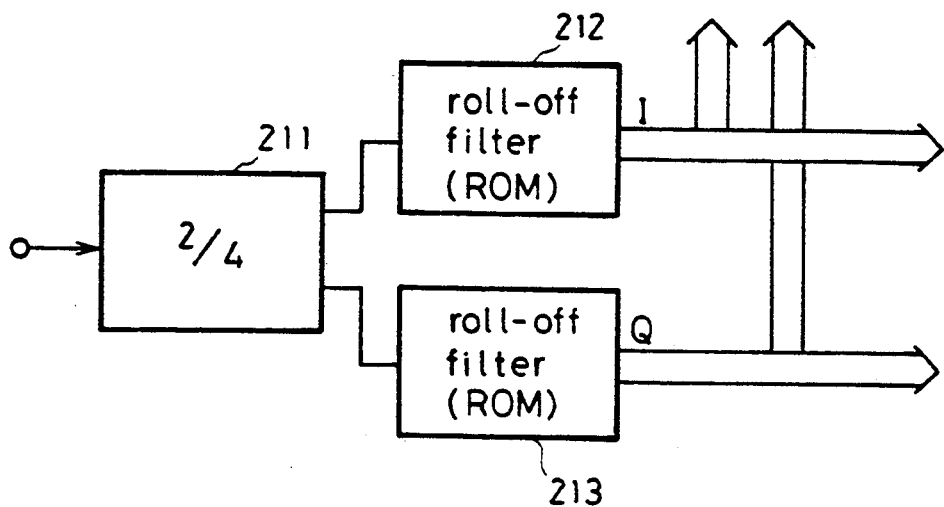
FIG. 4 is a block diagram to show an embodiment of the complex envelope generator.

FIG. 4 is a block diagram to show an embodiment of the complex envelope generator 21.

This circuit comprises a binary/quarternary level converter 211 and two roll-off filters 212, 213. The roll-off filters 212, 213 comprise, for instance, ROMs.

Figure 5:
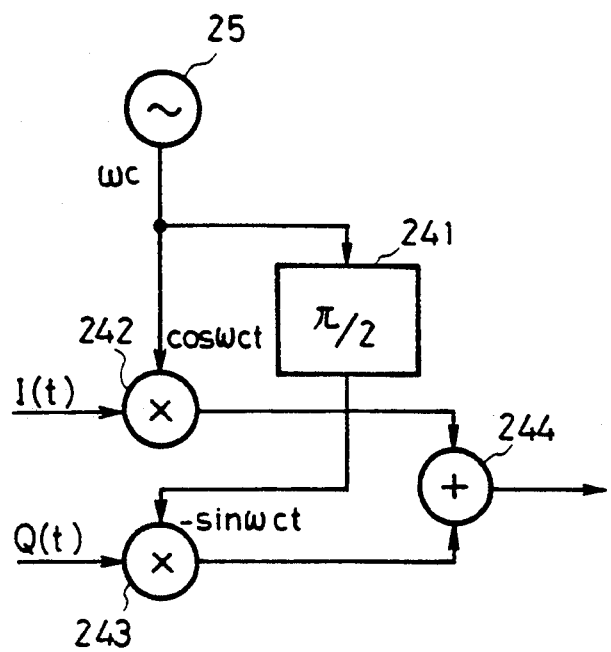
FIG. 5 is a block diagram to show an embodiment of the quadrature modulator.

FIG. 5 shows in a block diagram an embodiment of the quadrature modulator 24.

The quadrature modulator 24 comprises a
/2 phase shifter 241 which shifts the phase of the carrier fed from the local oscillator 25 by
/2, multipliers 242, 243 which multiply the base band signals I(t) and Q(t) with the carrier which has passed the
/2 phase shifter 241 and with the carrier which has not passed it respectively and an adder 244 which adds the outputs from the two multipliers 242, 243.

Figure 6:
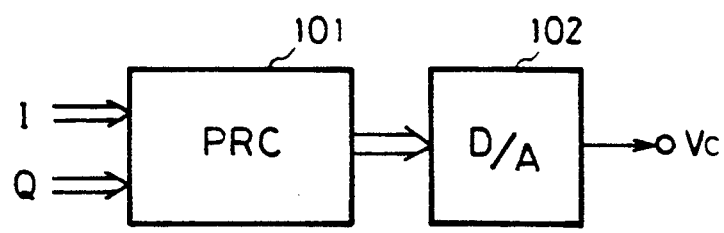
FIG. 6 is a block diagram to show an embodiment of the drain control signal generator.

FIG. 6 is a block diagram to show an embodiment of the drain voltage controller 10, which uses a numerical arithmetic processor 101.

The numerical arithmetic processor 101 obtains envelope R(t) from the input in-phase envelope component I(t) and the quadrature envelope component Q(t) by the equation (4), and outputs the same to a D/A converter 102 with or without slight compensation. The D/A converter 102 converts the signal into an analog voltage and outputs the same.

Figure 7:
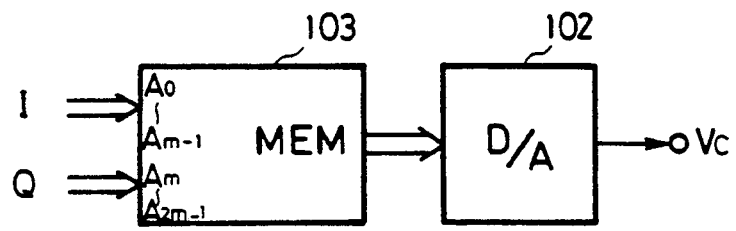
FIG. 7 is a block diagram to show another embodiment of the drain control signal generator.

FIG. 7 shows another embodiment of the drain voltage controller 10 wherein the processor 101 is replaced with a memory table 103 to simplify the construction.

It is assumed that the values of the in-phase envelope component I(t) and the quadrature envelope component Q(t) are denoted with the data of m bits respectively. A read-only memory or a random access memory is used as the memory table 103, and the data of the in-phase envelope component I(t) are inputted at the address $A_0$-$A_{m-1}$, while the data of the quadrature envelope component Q(t) are inputted at the address $A_m$-$A_{2m-1}$. Addresses of the memory table 103 are written in advance with the values of the envelope R(t) corresponding to the data of the in-phase envelope component I(t) and the quadrature envelope component Q(t) or the compensated values thereof. Therefore, the same function as shown in the structure of FIG. 6 can be realized with a simpler construction by converting the output from the memory table 103 into analog voltage using a D/A converter 102.

As described in the foregoing, this embodiment generates drain control signals $V_S$ by digital processing based on the complex envelope data of the modulation unit 20. Therefore, it can provide drain control signals $V_S$ which are precise, highly stable and less vulnerable to temperature changes and manufacture fluctuation. As the drain voltage controller 10 can be constructed with digital circuits similar to the complex envelope generator 21, it can be easily structured as an LSI which incorporates the base band processing unit of the modulation unit 20 to thereby reduce the number of necessary component parts.

Figure 8:
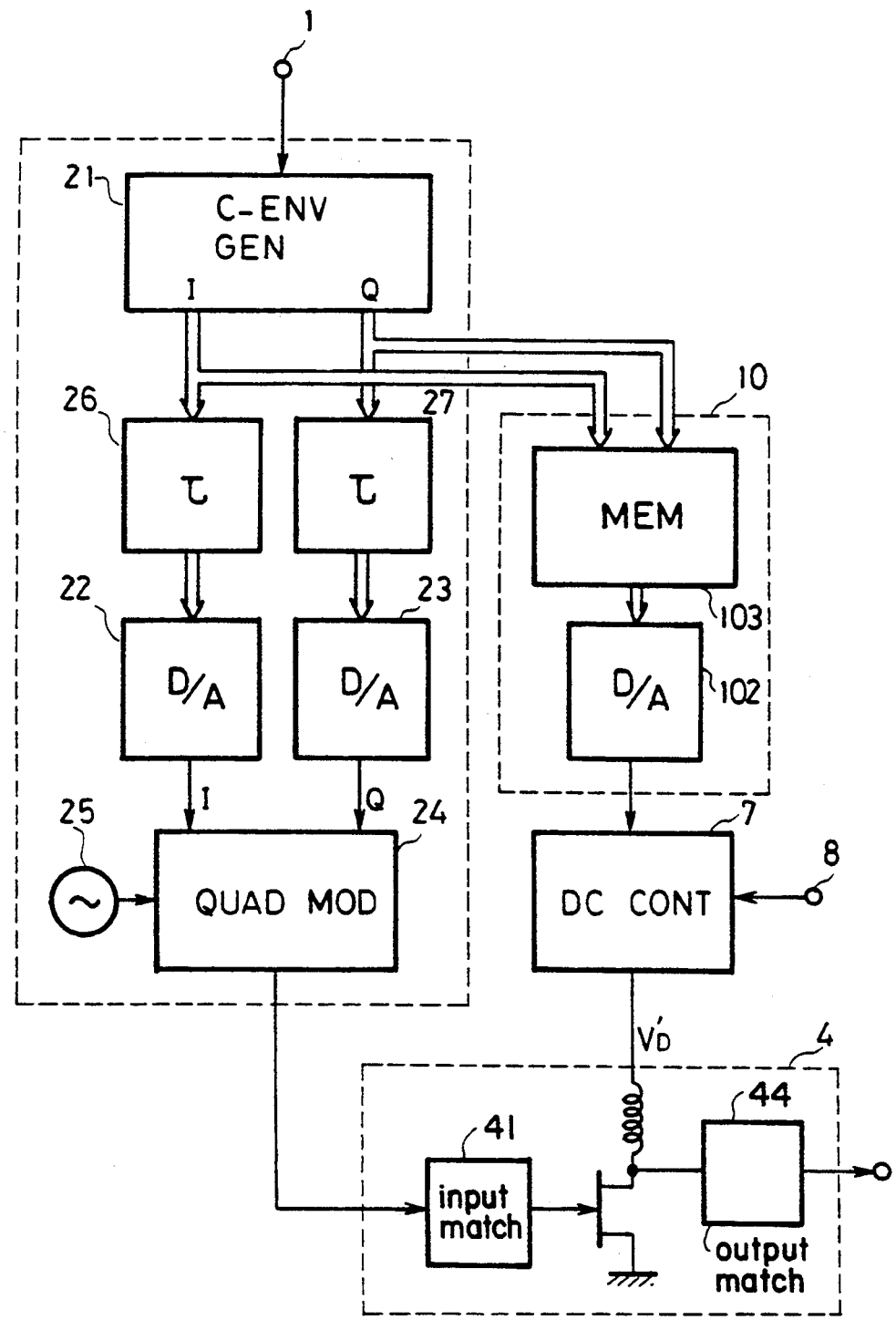
FIG. 8 is a block diagram to show the second embodiment of this invention.

FIG. 8 is a block diagram to show the second embodiment of the linear transmitter according to this invention. This embodiment differs from the first embodiment in that delay time between the drain bias and the modulated signal e(t) is adjusted.

In order to reduce distortion sufficiently with the drain control, it is necessary that the time waveform of the drain bias voltage $V_D'$ outputted from the DC voltage controller 7 corresponds precisely with the envelope waveform of the modulated signal e(t) outputted from the quadrature modulator 24 in time. However, as the DC voltage controller 7 has a limited frequency band, delay is inevitably caused in practice. This makes the envelope waveform of the modulated signal e(t) and the waveform of the drain bias voltage disagree timewise in an amplification device to thereby impair the effect of distortion reduction.

In this embodiment, data delay circuits 26, 27 are respectively inserted on the input sides of the D/A converters 22, 23. They offset the delay at the DC voltage controller 7 to achieve sufficient effect of distortion reduction.

Shift registers or the like may be used as the data delay circuits 26, 27.

Figure 9:
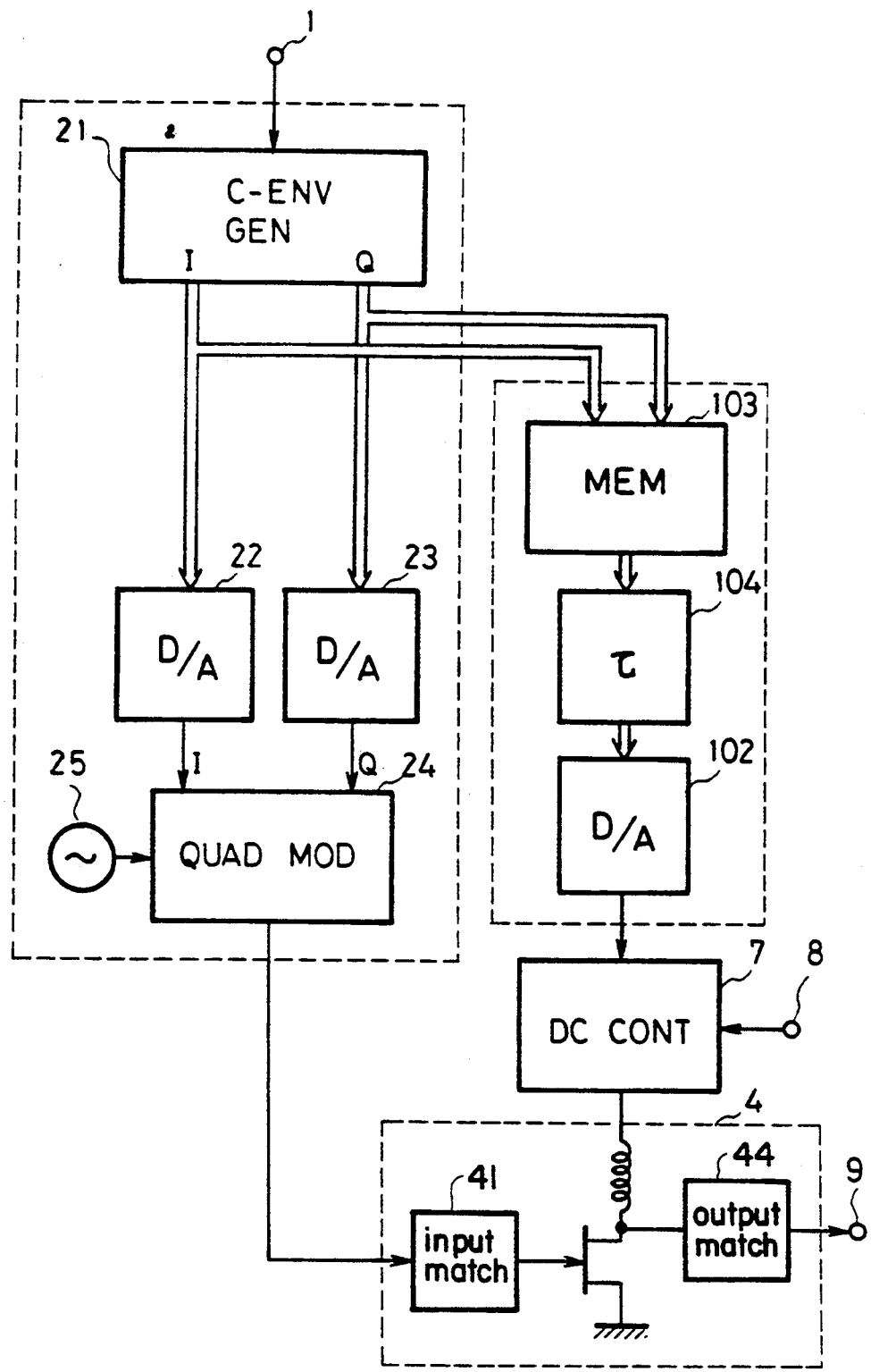
FIG. 9 is a block diagram to show the third embodiment of this invention.

FIG. 9 is a block diagram to show the third embodiment of this invention linear transmitter.

In the construction of the first embodiment, a narrow-band pass filter is sometimes inserted at the output of the quadrature modulator 24 in order to remove spurious components other than the modulated signal. In such a case, the delay time at the band pass filter becomes larger than the delay time at the DC voltage controller 7. Then, the drain bias voltage should be delayed.

The embodiment shown in FIG. 9 of the structure suitable to such a case, and is different from the first embodiment in that a data delay circuit 104 is inserted on the input side of the D/A converter 102 within the drain voltage controller 10. It may be inserted at the stage preceding the memory table 103 or the numerical arithmetic processor 101.

In the second and third embodiments, distortion reduction can be sufficiently achieved even when the delays at respective units of the circuit are not negligible, if the delay time is adjusted by delaying the data in a digital manner.

Analog circuits such as delay lines may be used to realize this invention. In that case, they are inserted at the output of the D/A converters, the output of the quadrature modulator 24, the output of the drain voltage controller 10, the input of the DC voltage controller 7 or the output of the DC voltage controller 7.

In the above embodiments, the DC voltage controller 7 is structured to amplify extremely low frequency in order to obtain an output which is constant as against the input voltage. Therefore, the cut-off frequency at input/output is extremely low or at about 10 KHz. The DC voltage controller 7 therefore cannot quite follow the changes in the modulated signal at the amplifier for the modulated signal which changes at frequencies higher than the cut-off frequency. As a result, output becomes distorted. For instance, the frequency characteristics of a switching regulator depend on the switching frequency for control or filters within the regulator. The frequency characteristics may be improved by increasing the switching frequency for control, but as they are limited by the switching characteristics of transistors and diodes which are the switches, they still remain in the range of 500 KHz at best. Therefore, sufficient frequency characteristics are difficult to obtain. This in turn makes it difficult to realize a linear transmitter for the signals of higher frequency.

The following embodiments (from 4th through the 6th) obviate above-mentioned defects and enhance the bandwidth of frequency characteristics equivalently with simple constructions.

Figure 10:
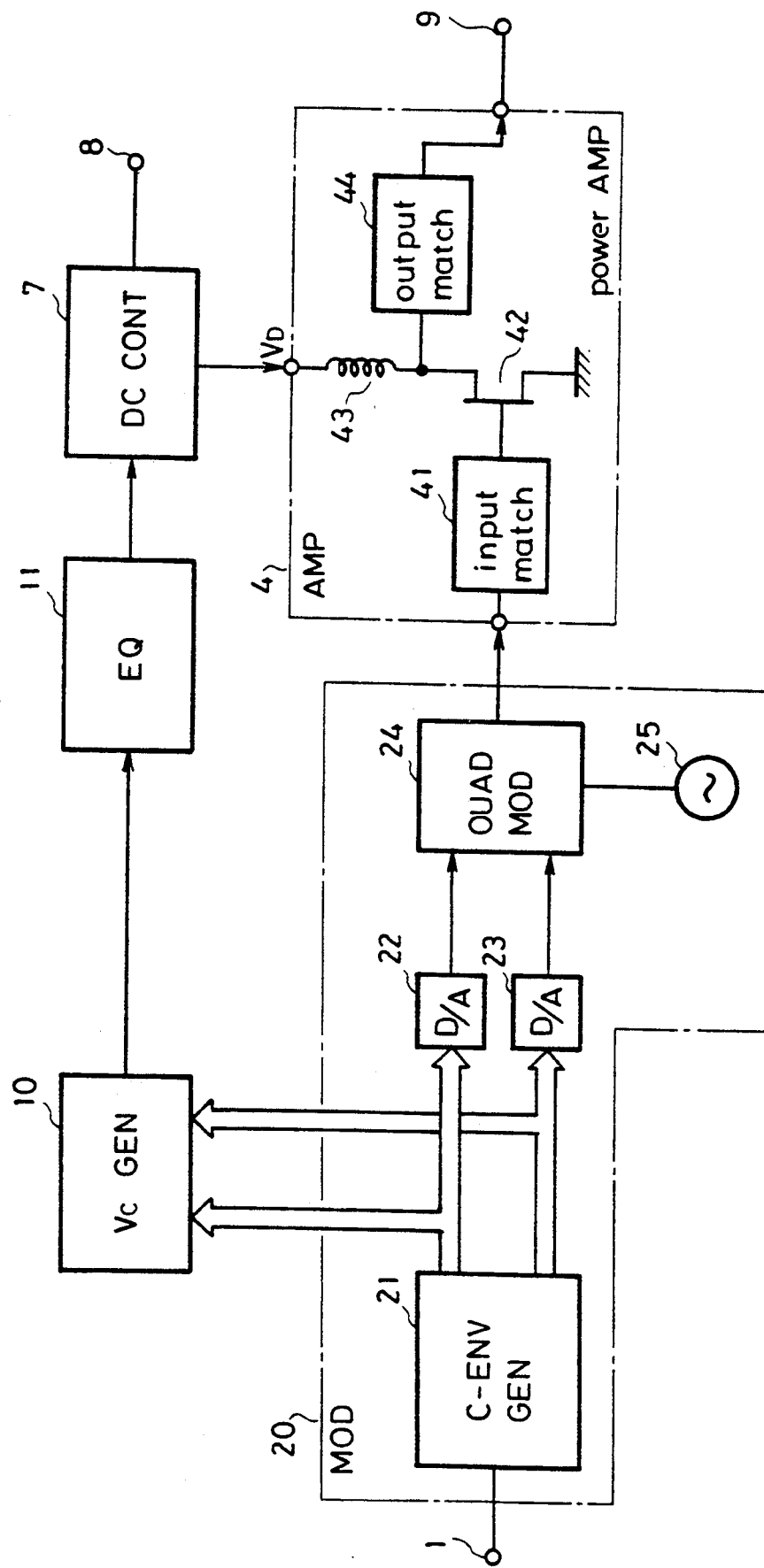
FIG. 10 is a block diagram to show the fourth embodiment of this invention.

FIG. 10 shows in block diagram the fourth embodiment of this invention linear transmitter.

This embodiment differs from the first embodiment shown in FIG. 3 in that a frequency equalizer 11 is further provided in order to equalize the output amplitude and the phase of the drain voltage controller 10 and supplies the same to the DC voltage controller 7.

Figure 11:
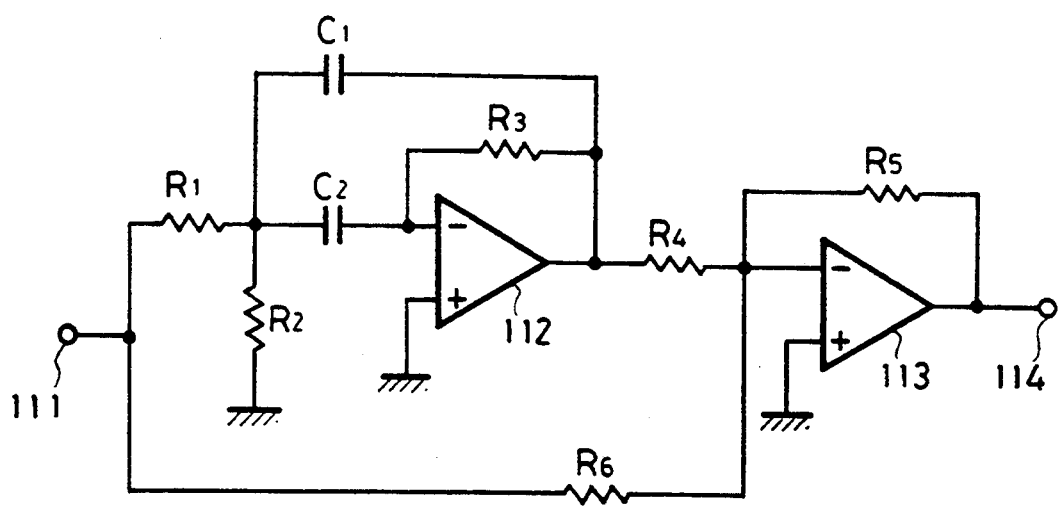
FIG. 11 is a block diagram to show an embodiment of the frequency equalizer circuit.

FIG. 11 is a block diagram to show the frequency equalizer 11 in more detail. The equalizer 11 includes resistors R1 through R6, capacitors C1 and C2, and operational amplifiers 112 and 113. The resistors R and R6 are connected on one end thereof to an input 111 while the resistor R1 is commonly connected on the other end to one end of the capacitors C1 and C2 respectively. The other end of the resistor R2 is grounded. The other end of the capacitor C1, the other end of the resistor R3 and one end of the resistor R4 are connected to an output of the operational amplifier 112. The other end of the capacitor C2 and one end of the resistor R3 are connected to the inverted input of the operational amplifier 112. The non-inverted input of the operational amplifier 112 is grounded. The other end of the resistor R4, one end of the resistor R5 and the other end of the resistor R6 are connected to the inverted input of the operational amplifier 113. The non-inverted input of the operational amplifier 113 is grounded, and the output from the amplifier 113 is connected to the other end of the resistor R5 and an output 114.

Figure 12:
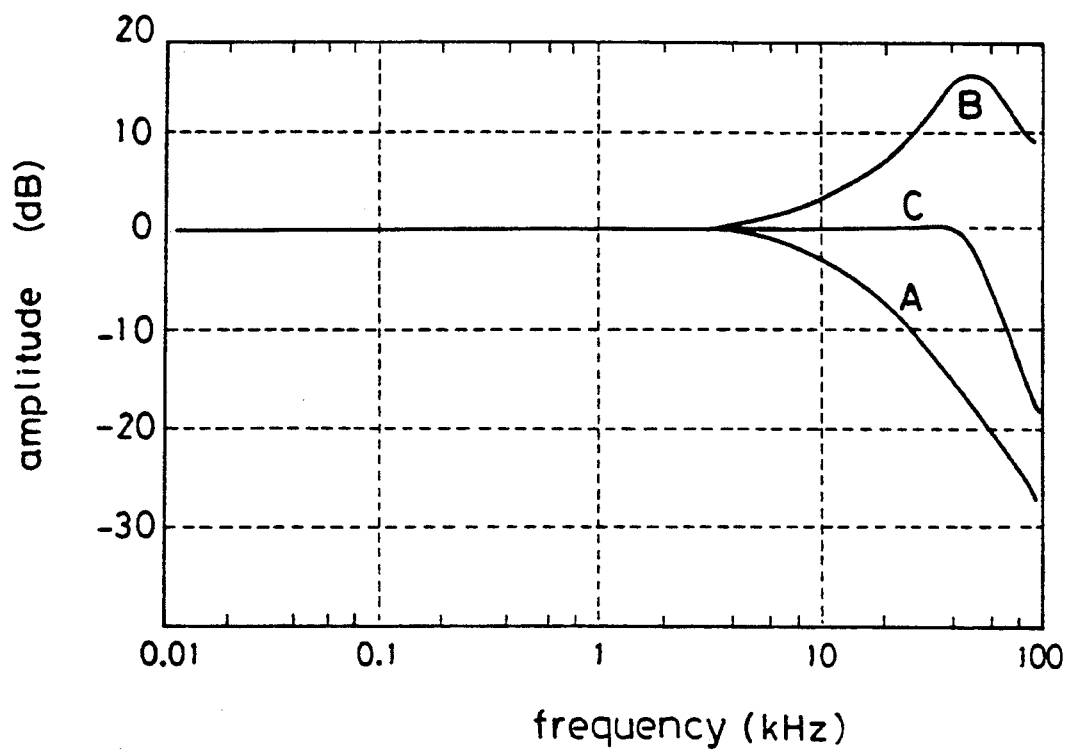
FIG. 12 is a graph to show an example of frequency characteristics.

The operation of this embodiment will now be described referring to FIG. 12. FIG. 12 shows frequency characteristics of the DC voltage controller 7 before and after equalization of the frequency, as well as the frequency characteristics of the circuit 11.

In FIG. 12, the curve A indicates the frequency characteristics of the controller 7 before equalization and the cut-off frequency thereof remains less than 10 KHz. As a result of equalization, the frequency characteristics of the equalizer 11 become as indicated by the curve B with an amplitude increase in radio frequency. The equalizer signals are inputted at the controller 7 to improve the high frequency characteristics as indicated by the curve C as well as to increase the cut-off frequency to 50 KHz or higher. The drain voltage $V_D$ of the power amplifier 4 is controlled with the improved output voltage from the controller 7 to thereby enable amplification of modulated signals at high speed.

As shown in FIG. 11, the frequency equalizer 11 having such frequency characteristics can be simply structured with operational amplifiers, resistors and capacitors. see "Electric Filter Design Handbook" by A. B. William, published from MacGrow-Hill.)

Figure 13:
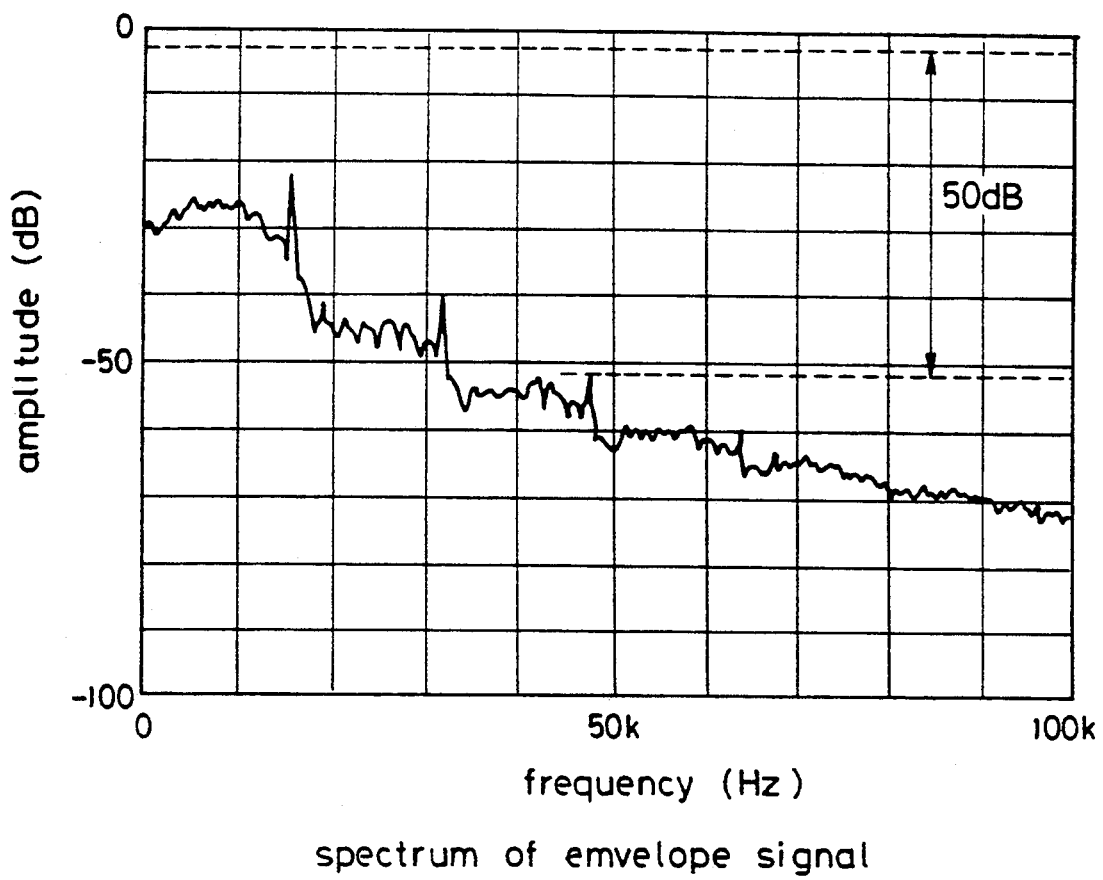
FIG. 13 is a graph to show an example of envelope spectrum.

FIG. 13 is a graph to show an example of the spectrum of the envelope signals in QPSK modulation system or more particularly the frequency distribution of the signal R(t) of the equation (4). In the graph, the roll-off=0.5, and transmission rate is 32 Kb/s. In order to restrict distortion of amplitude of the power amplifier 4 at 50 dB or less, the frequency characteristics of the controller 7 are required to contain spectrum components up to the one which is lower than the DC component by 50 dB. Therefore the band up to ca. 40–50 KHz will be needed in this case. As described in relation to FIG. 12, as the controller 7 has the cut-off frequency at ca. 50 KHz or higher, it sufficiently satisfies the requirement.

As described above, the circuit operation can be increased in speed with a simple construction by equalizing the frequency at the input/output of the DC voltage controller 7.

Figure 14:
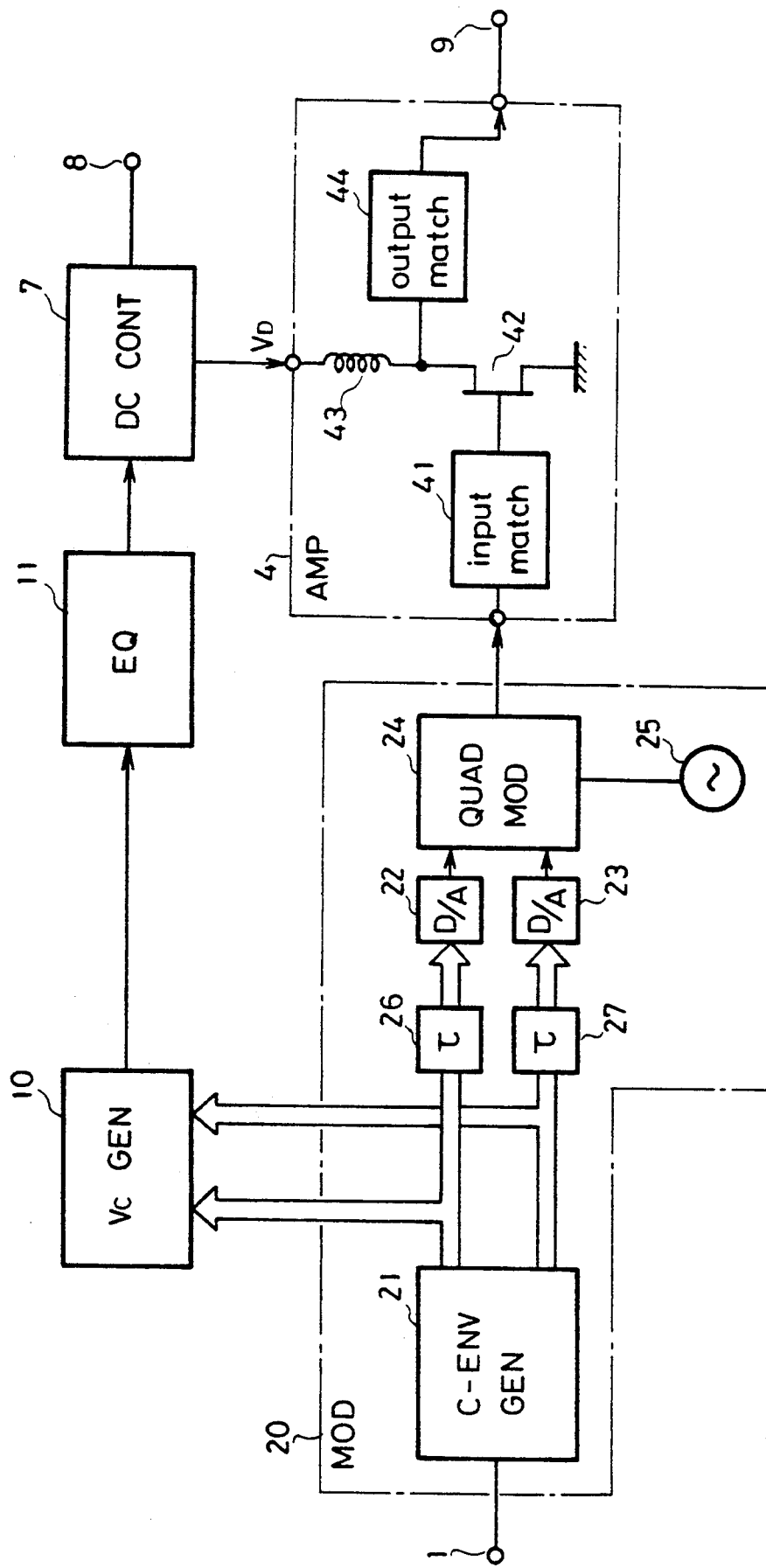
FIG. 14 is a block diagram to show the fifth embodiment of this invention.
Figure 15:
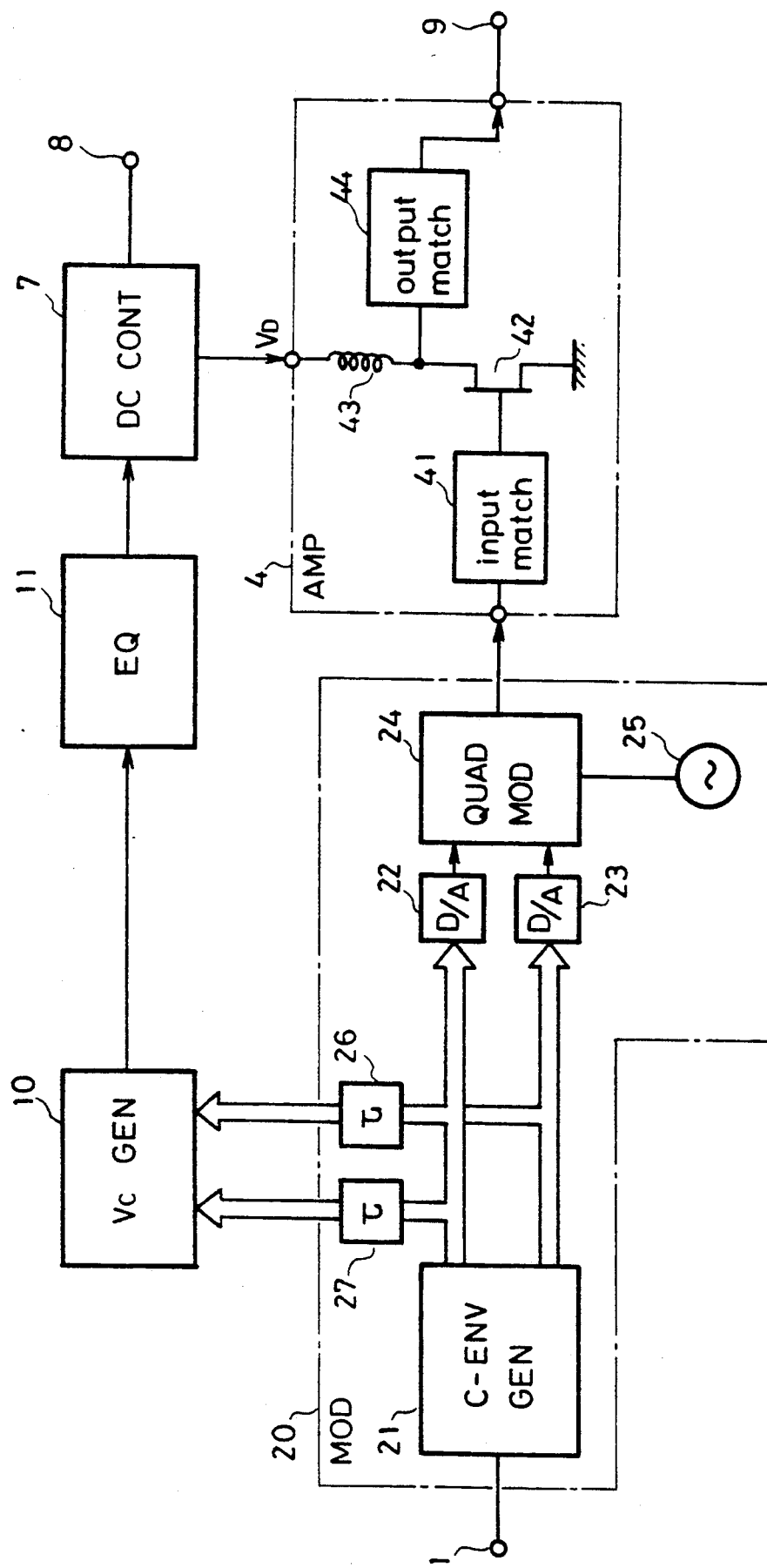
FIG. 15 is a block diagram to show the sixth embodiment of this invention.

FIG. 14 is a block diagram to show the fifth embodiment of this invention, and FIG. 15 a block diagram to show the sixth embodiment thereof.

Like the fourth embodiment shown in FIG. 10, when the frequency equalizer 11 is inserted in the DC voltage controller 7, relative lead or delay occurs between the phase of the drain voltage $V_D$ of the power amplifier 4 and the envelope phase of the output signals of the modulation unit 2.

In the fifth embodiment, the phase of the drain voltage $V_D$ of the power amplifier 4 is delayed from the envelope phase of the input signal thereof. In such a case, similarly to the second embodiment shown in FIG. 8, delay circuits 26 and 27 comprising shift registers and the like are inserted between the complex envelope generator 21 and the quadrature modulator 24 to delay the modulated signals so that the signals become agreed with the phase of the drain voltage $V_D$ of the power amplifier 25. This can reduce distortion which is caused by the control delay of the drain voltage $V_D$.

When the lead or the delay occurs in opposite direction, and if the drain voltage $V_D$ of the power amplifier 4 shows a lead, delay circuits 26, 27 are inserted on the input side of the drain voltage controller 10. Similarly to the third embodiment shown in FIG. 9, delay may be caused within the drain voltage controller 10. These delays may be realized with analog circuits similarly as in the third embodiment.

In the above embodiments, when the power amplifier is constructed with active devices, and bias voltages thereof are decreased, the active devices will be suspended in operation at a certain voltage level $V_{TH}$ or lower. In other words, the gain of the power amplifier becomes less than 0 dB. This is because the amplification factor (i.e. the mutual conductance in the case of FETs and the current amplification factor in bipolar transistors) drastically decreases due to the power drop. Therefore, at the bias voltage level of $V_{TH}$ or lower, the power amplifier will not operate.

The modulated signals, on the other hand, can be changed to a level considerably lower than that. If the bias voltage of the power amplifier is controlled with the envelope signals, bias voltage having the gain characteristic of 0 dB or less is applied to the power amplifier. Therefore the output signal in radio frequency becomes unavoidably distorted.

In other words, when the bias voltage of the power amplifier is controlled in accordance with the envelope of the modulated signal to operate the power amplifier linearly at a high efficiency, a notable distortion might occur at the output because of the voltage level $V_{TH}$ at or below which the amplification factor becomes less than 0 dB.

Description will be given below to embodiments which can overcome the above-mentioned problem and can maintain linearity even if the level of input signals is low.

Figure 16:
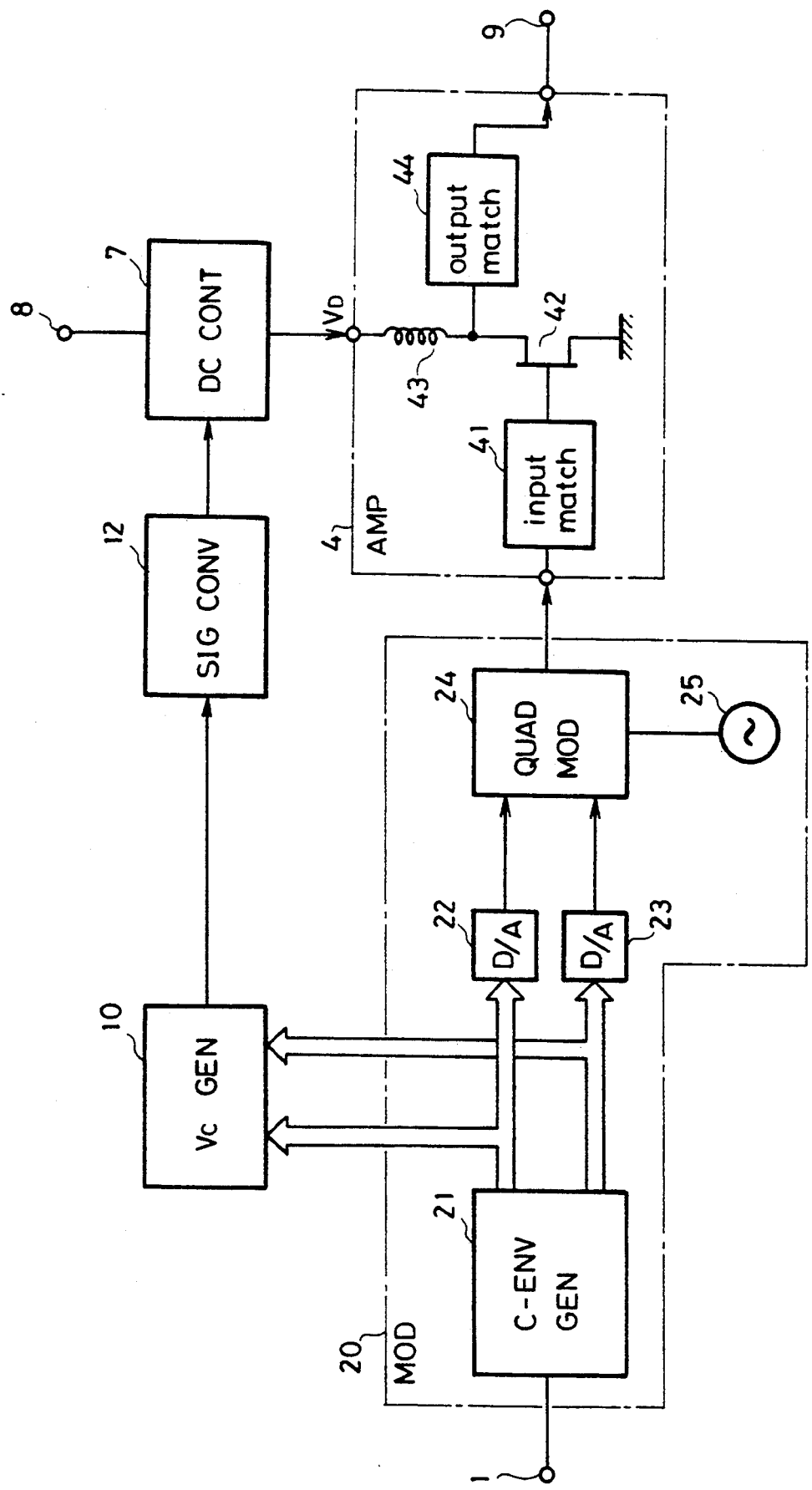
FIG. 16 is a block diagram to show the seventh embodiment of this invention.

FIG. 16 is a block diagram to show the seventh embodiment of this invention.

This embodiment differs from the first embodiment shown in FIG. 3 in that a signal converter 12 is provided as the minimum bias voltage hold means which maintains the output voltage from the DC voltage controller 7 at a given value or higher when the level of the input signal envelope is lower than a prescribed value.

Figure 17:
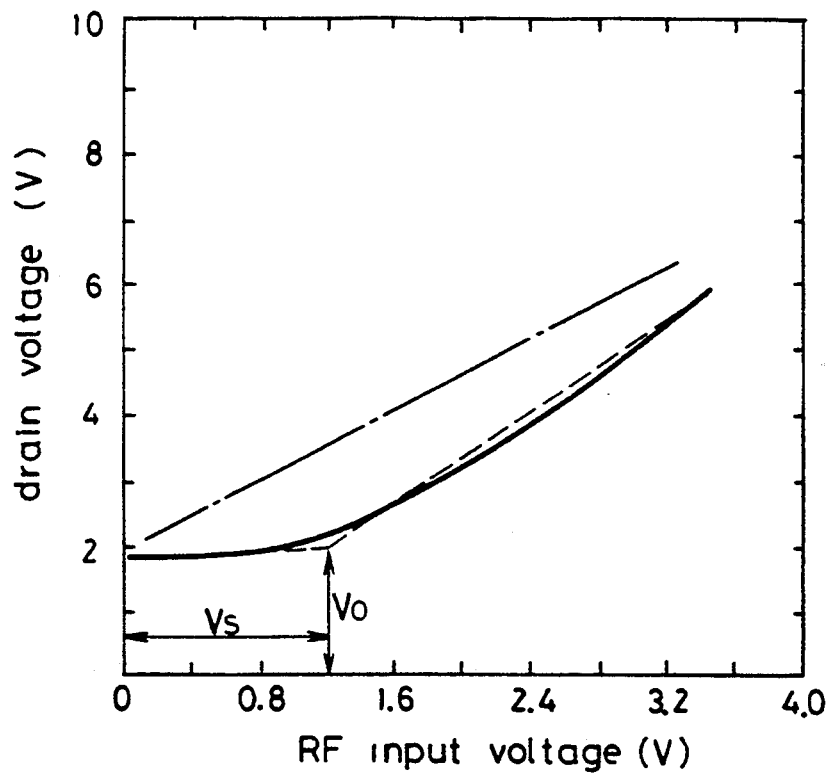
FIG. 17 is a graph to show an example of drain voltage characteristics where the gain of the radio frequency power amplifier becomes constant as against input voltage.

FIG. 17 shows the drain voltage characteristics where the gain of the power amplifier 4 becomes constant in respect of the radio frequency input voltage.

In the figure, a dot-and-chain line indicates the case where the power amplifier 4 operates with the drain voltage at a given value or higher (in the case shown in FIG. 17, about 2 V), and where the relation of the radio frequency input voltage against the drain voltage is substantially linear. In such a case, the linearity of the power amplifier 4 may be maintained by amplifying the output from the envelope detector 5 at a suitable amplification factor and by shifting the voltage level thereof.

On the other hand, when the drain voltage characteristics are not linear as against the radio frequency input voltage, substantially constant drain voltage is sometimes required in the region where the input voltage is low, as shown with the solid line in FIG. 17. In such a case, the curve should be approximated as shown with the broken line in the graph. More particularly, when the radio frequency input voltage is less than $V_S$, a drain voltage of a constant value $V_O$ is required.

Figure 18:
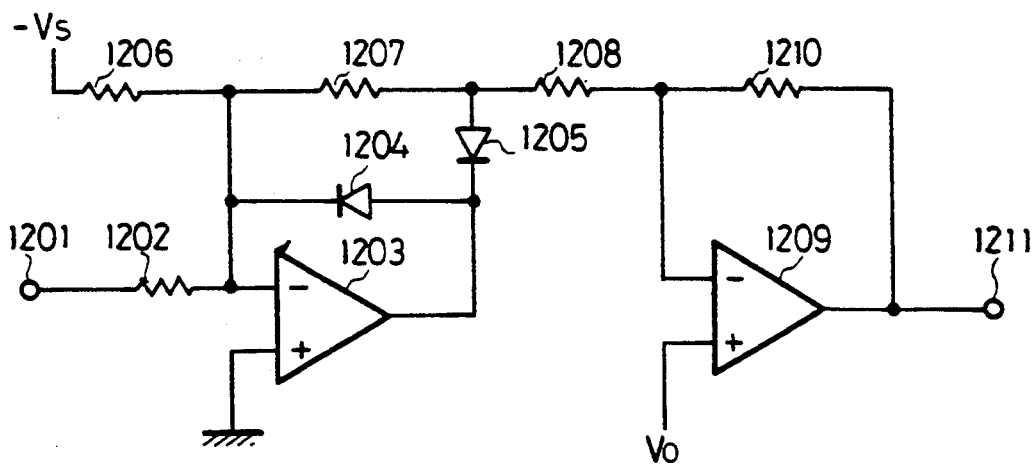
FIG. 18 is a circuit diagram to show an embodiment of the signal converter.

When the input voltage exceeds the value $V_S$, the curve is approximated if a drain voltage which increases linearly as against the ratio frequency input voltage is needed. FIG. 18 shows an embodiment of the signal converter which attains such characteristics.

The envelope signal outputted from the drain voltage controller 10 is inputted at an input 1201. The input 1201 is connected to the inverted input of the operational amplifier 1203 via a resistor 1202. The non-inverted input of the operational amplifier 1203 is grounded. The output from the operational amplifier 1203 is connected to an anode of a diode 1204 as well as to a cathode of a diode 1205. The cathode of the diode 1205 is connected to the inverted input of the amplifier 1203. The inverted input is further supplied with the voltage $-V_S$ via a resistor 1206. The contact between the resistor 1206 and the operational amplifier 1203 is connected to the anode of the diode 1205 via a resistor 1208. The anode of the diode 1205 is further connected to the inverted input of an operational amplifier 1209 via the resistor 1208. The voltage $V_O$ is supplied at the non-inverted input of the amplifier 1209. The output from the operational amplifier 1209 is fed back to the inverted input via a resistor 1210 as well as outputted to the DC voltage controller 7 via an output 1211.

When the level of the signal at the input 1201 is at the voltage $V_S$ or lower, the diode 1204 is connected while the diode 1205 is disconnected, and the operational amplifier 1203 becomes a non-inverting amplifier with the gain (1). As the non-inverted input of the amplifier 1203 is grounded, the output thereof becomes zero potential. This makes the voltage $-V_S$ to be applied at the resistor 1208 via the resistors 1206 and 1207.

When the signal level of the input 1201 exceeds the voltage $V_S$, the diode 1204 is disconnected while the diode 1205 is connected, and the operational amplifier 1203 becomes an inverting amplifier.

The operational amplifier 1209 amplifies the signals from the resistor 1208 in addition to the offset voltage $V_O$. The drain bias voltage of the power amplifier 4 can be controlled as shown with the broken line in FIG. 17 by supplying the amplified signal to the DC voltage controller 7 via the output 1211. The gradient, when the radio frequency input voltage exceeds $V_S$, may be set by selecting properly the values of the resistors 1207 and 1210.

Figure 19:
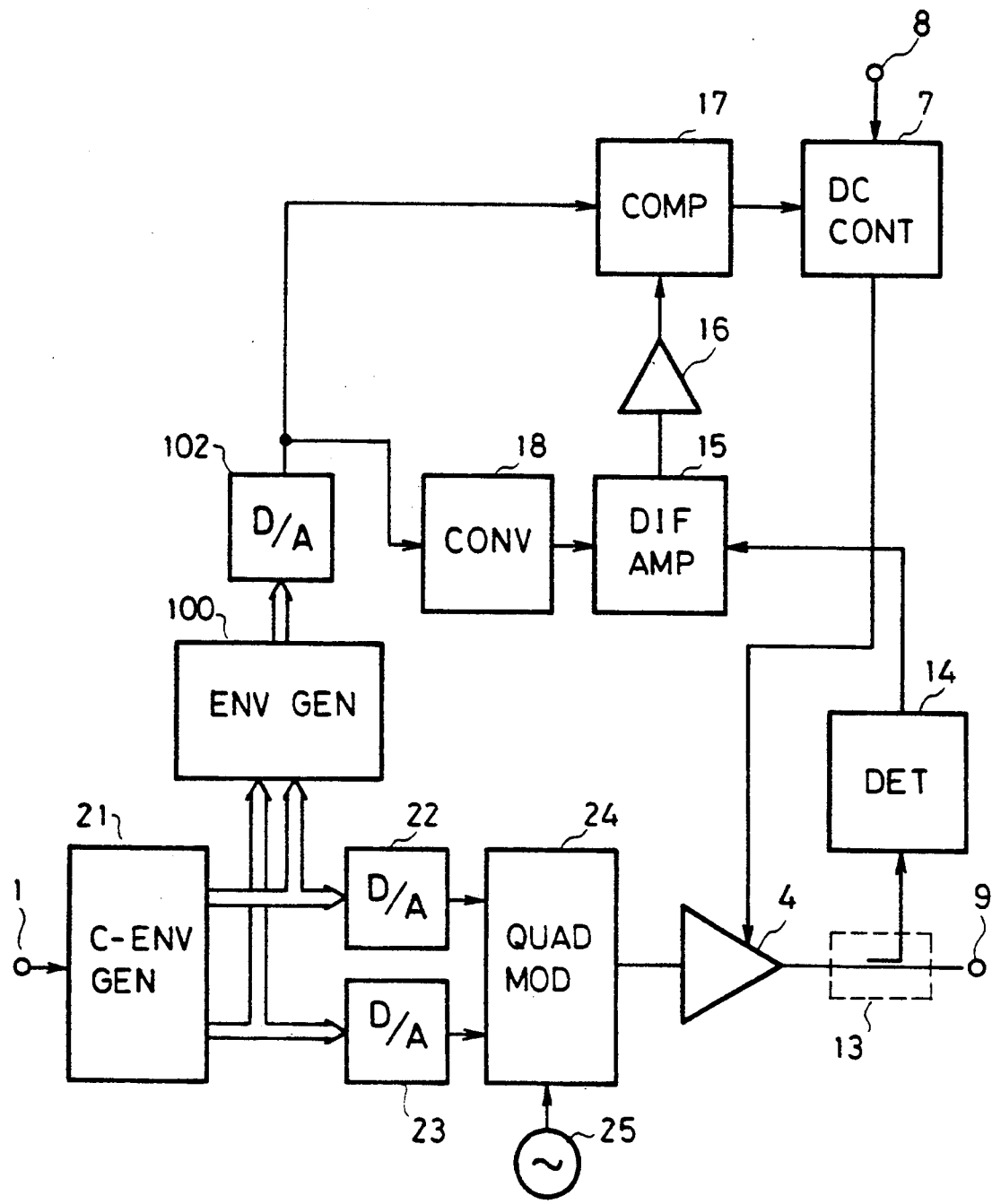
FIG. 19 is a block diagram to show the eighth embodiment of this invention.

FIG. 19 is a block diagram to show the eighth embodiment of this invention.

This embodiment of the linear transmitter differs from the first embodiment in that it is provided with a directional coupler 13 and an envelope detector 14 as the output detecting means to obtain the envelope of the modulated signal from the power amplifier 4, an differential amplifier 15, a DC amplifier 16 and a compensate circuitry 17 as the envelope compensating means to compensate the output signal of the drain control signal generator which is to be inputted at the DC voltage controller 7 based on the difference between the output from the envelope detector 14 and the output from the drain control signal generator, and a signal converter 18 as the detector characteristics compensating means to compensate the difference in characteristics between the drain voltage controller 10 and the envelope detector 14. The drain control signal generator is formed herein with an envelope generator 100 and a D/A converter 102. The envelope generator 100 is a circuit which is equivalent to abovementioned numerical arithmetic processor 101 or the memory table 103.

Power amplifiers for radio frequency in general change in characteristics thereof due to manufacture errors and the ambient temperature changes. In order to obviate such inconvenience, this embodiment is adapted to compare the envelope on the output side with the envelope on the input side and to compensate the control signals for the controller 7. More particularly, an error in output as against the input is obtained by the differential amplifier 15 and is supplied to the compensate circuitry 17 via the DC amplifier 16. The compensate circuitry 17 compensates the control signal fed to the controller 7 from the D/A converter 102 with the output from the DC amplifier 16. As the compensate circuitry 17, an arithmetic operation circuit for addition or subtraction is used to either increase or decrease the envelope signal on the input side so as to obtain linearity in the amplitude characteristics of the power amplifier for radio frequency.

In order to suppress the distortion by 50 dB in the structure mentioned above, suppression of distortion in the feedback loop by 20–30 dB will suffice because distortion of 20–30 dB can be sufficiently suppressed by controlling the power voltage with the output from the drain control signal generator comprising the envelope generator 100 and the D/A converter 102 on the input side. The gain required for the DC amplifier 16 is therefore 20–30 dB at most. This embodiment can therefore use an extremely stable negative feedback loop with a small loop gain.

Figure 20:
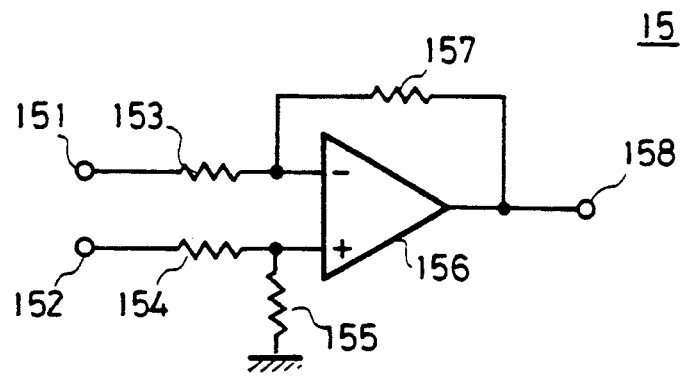
FIG. 20 is a circuit diagram to show an embodiment of the differential amplifier.
Figure 21:
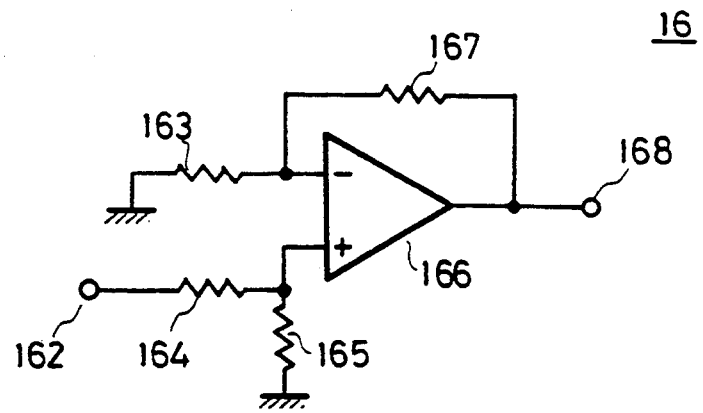
FIG. 21 is a circuit diagram to show an embodiment of the DC amplifier.
Figure 22:
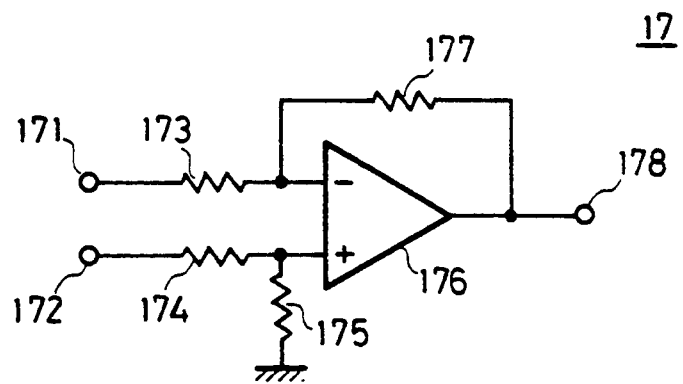
FIG. 22 is a circuit diagram to show an embodiment of the compensate circuitry.

FIGS. 20 through 22 show respectively embodiments of the differential amplifier 15, DC amplifier 16 and compensate circuitry 17.

The differential amplifier 15 comprises inputs 151, 152, an output 158, operational amplifier 156, and resistors 153, 154, 155 and 157. The output from the D/A converter 102 and the output from the envelope detector 14 are separately supplied to the inputs 151, 152. Signals from the inputs 151, 152 are supplied to the operational amplifier 156 via resistors 153, 154. The non-inverted input of the operational amplifier 156 is grounded via the resistor 155 while the output is connected to the non-inverted input via the resistor 157.

The DC amplifier 16 includes an input 162, an output 168, an operational amplifier 166, and resistors 163, 164, 165 and 167. The output from the differential amplifier 15 is supplied to the input 162, and to the non-inverted input of the operational amplifier 166 via the resistor 164. The non-inverted input of the operational amplifier 166 is further grounded via the resistor 165. The inverted input of the operational amplifier 166 is grounded via the resistor 163 while the output thereof is connected to the inverted input via the resistor 167.

The compensate circuitry 17 includes inputs 171, 172, an output 178, an operational amplifier 176, and resistors 173, 174, 175, and 177. The inputs 171, 172 are respectively supplied with the outputs from the D/A converter 102 and the DC amplifier 16. The signals from the inputs 171, 172 are supplied to the operational amplifier 176 via resistors 173, 174 respectively. The non-inverted input of the operational amplifier 176 is grounded via the resistor 175 while the output thereof is connected to the inverted input via a resistor 177.

It should be noted that whereas the envelope obtained by the generator 100 and the D/A converter 102 is a linear signal, the envelope obtained by the detector 14 contains effect of non-linear characteristics. In order to compare the two envelopes accurately, non-Linear characteristics of the detector 14 should be offset.

For this purpose, between the D/A converter 102 and the differential amplifier 15 is inserted a signal converter 18 which either has the same structure as the envelope detector 14 or can realize substantially the same characteristics as the detector 14. This converter 18 offsets the influence of the characteristic of the detector 14 from the output from the differential amplifier 15 so that the difference between the input envelope and the output envelope signal is outputted.

Figure 23:
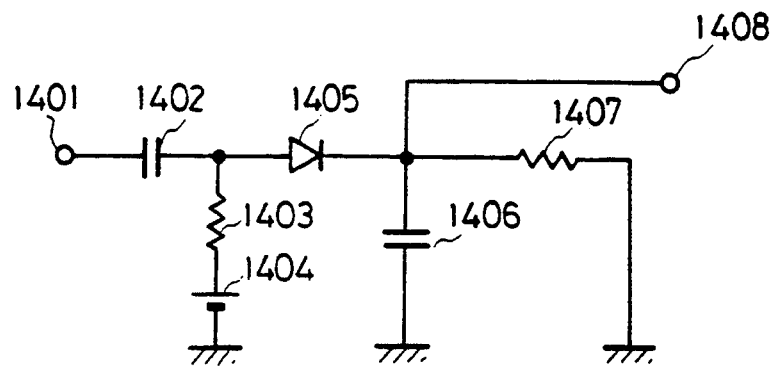
FIG. 23 is a circuit diagram to show an embodiment of the envelope detector.
Figure 24:
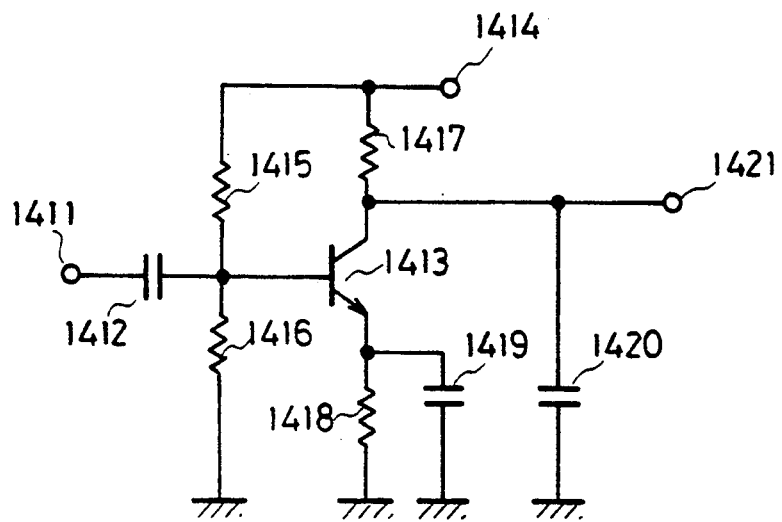
FIG. 24 is a circuit diagram to show another embodiment of the envelope detector.

FIGS. 23 and 24 show embodiments of the envelope detector 14 in circuit diagram respectively.

There has been known as the envelope detector a circuit using diodes or transistors. FIG. 23 shows the circuit with diodes while FIG. 24 shows the one with transistors.

In the circuit shown in FIG. 23, a modulated signal input 1401 is connected to an anode terminal of the diode 1405 via a capacitor 1402, and the cathode terminal of the diode 1405 is connected to the output 1408. The diode 1405 is supplied with the bias voltage from the power source 1404 via resistors 1403, 1407. The output side of the diode 1405 is grounded via the capacitor 1406.

The modulated signal inputted at the input 1401 is removed of the DC component by the capacitor 1402, and then is inputted at the diode 1405. Components higher than the anode voltage of the diode 1405 alone are supplied to the capacitor 1406, and the carriers are rectified in half-wave. The capacitor 1406 causes the carriers to bypass, and outputs the envelope alone at the output 1408.

In the circuit shown in FIG. 24, the input 1411 is connected to the base terminal of the transistor 1413 via a capacitor 1412 for DC component removal. A power terminal 1414 is grounded via resistors 1415, 1416 for base voltage bias, and the contact between the two resistors 1415, 1416 is connected to the base terminal of the transistor 1413. The transistor 1413 is inserted between the power terminal 1414 and the grounding point via resistors 1417, 1418 for bias between the collector and emitter. The resistor 1418 for bias stabilization is connected parallel to a capacitor 1419 for DC bypass so as to be applied with DC component alone. The collector terminal of the transistor 1413 is grounded via a capacitor 1420 as well as connected to an output 1421.

The modulated signal inputted at the input 1411 is rectified in half-wave with the diode characteristics between the base and emitter and outputted at the collector terminal. The carrier of the output is removed by the capacitor 1420 so that only the envelope is outputted at the output 1421. Similar to the envelope detection by diodes, the output signal is superposed with the diode characteristics between the base and emitter.

Figure 25:
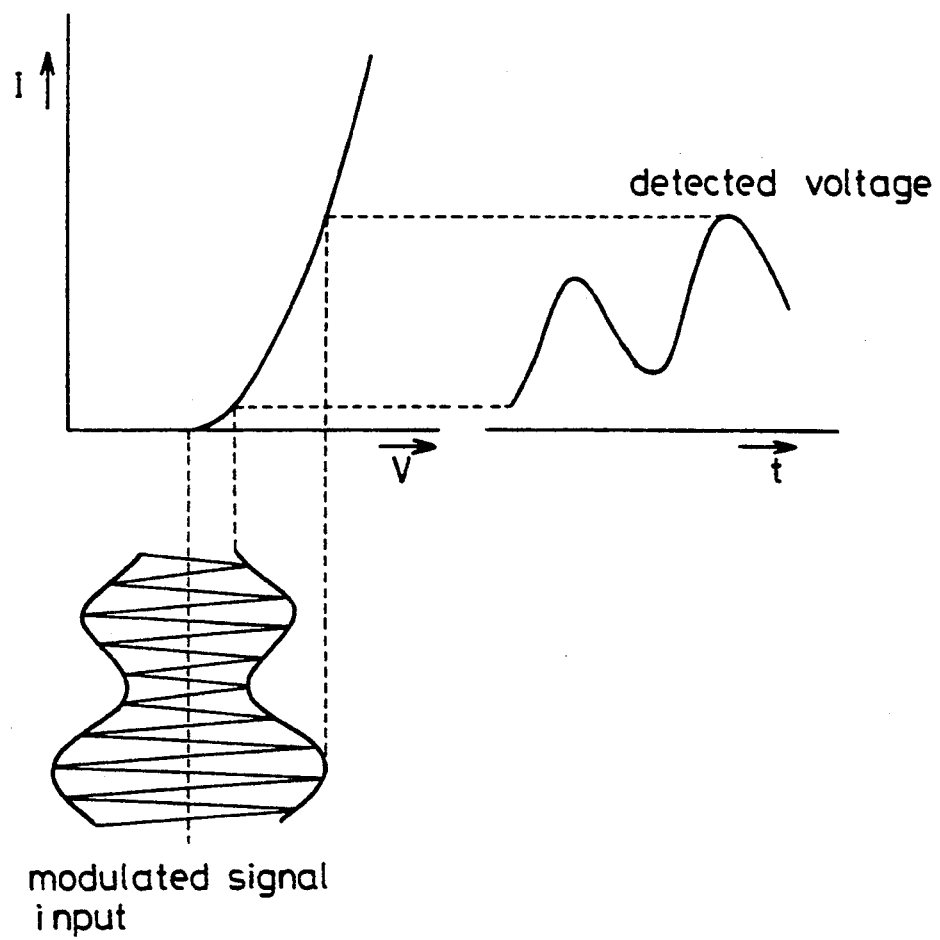
FIG. 25 is a graph to show an example of the diode characteristics.
Figure 26:
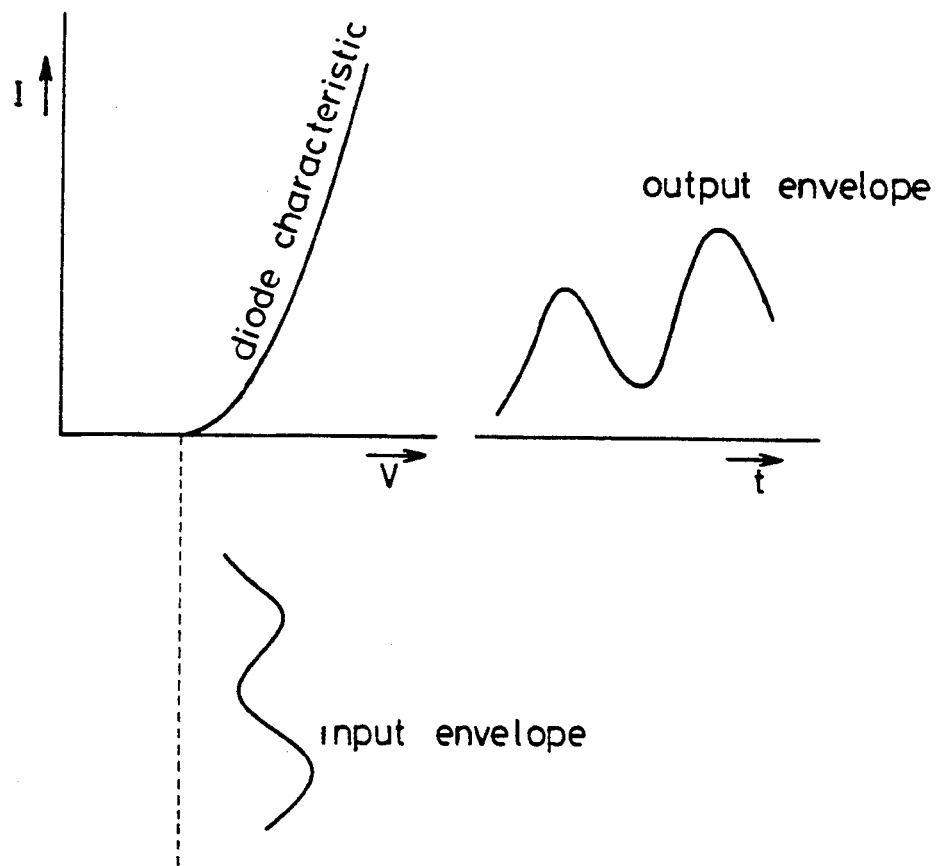
FIG. 26 is a graph to show an example of characteristics of the signal converter.

FIG. 25 shows an example of the diode characteristics, and FIG. 26 those of the signal converter 18.

When the diode within the envelope detector 14 shows such characteristics shown in FIG. 25, the signal converter 18 is also provided with the diode having the same characteristics, and the envelope signal outputted from the D/A converter 102 together with the bias voltage is inputted at the diode. At the output of the circuit 18 is outputted the envelope signal having the non-linear characteristics of the diode. The diode characteristics are offset from the error signal by generating the error signal from the envelope signal on the output side using the above-mentioned signal.

Figure 27:
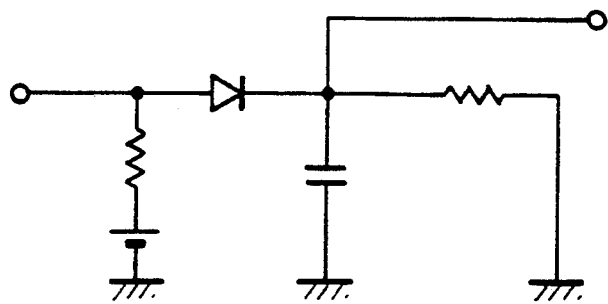
FIG. 27 is a circuit diagram to show an embodiment of the signal converter when the circuit shown in FIG. 23 is used as the envelope detector.
Figure 28:
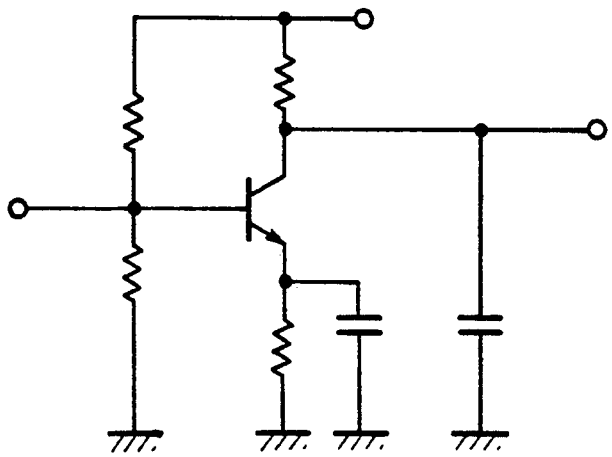
FIG. 28 is a circuit diagram to show the signal converter when the circuit shown in FIG. 24 is used as the envelope detector.

FIGS. 27 and 28 show embodiments of the signal converter 18 respectively. The circuit in FIG. 28 uses the circuit of FIG. 23 as the envelope detector 14 without its capacitor for DC component removal. The circuit of FIG. 28 uses the circuit shown in FIG. 24 as the envelope detector 14 without the capacitor 1412 for DC component removal.

Error signals can be generated without errors by using the semiconductor devices for the signal converter i8 that are substantially the same as the one used in the detector 14. The presence/absence of the capacitors 1406, 1420 for removing the carriers would not affect the characteristics.

Figure 29:
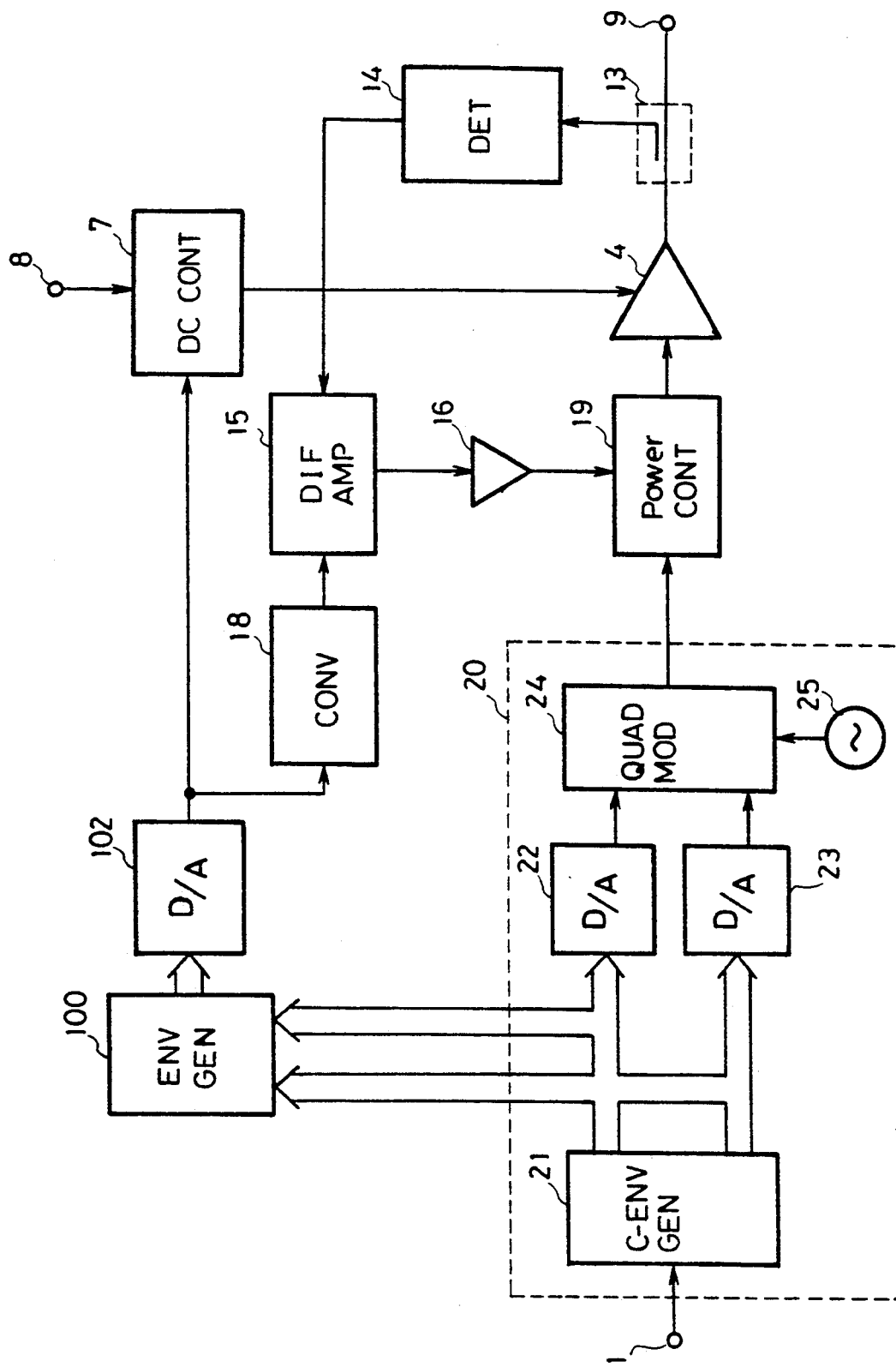
FIG. 29 is a block diagram to show the ninth embodiment of this invention.

FIG. 29 shows in block diagram the ninth embodiment of this invention.

This embodiment is identical to the eighth embodiment shown in FIG. 19 in that the difference between the input envelope and the output envelope is used, but is different from it in that the difference is used to control the input amplitude of the power amplifier 4.

More particularly, a power level controller 19 is inserted between the quadrature modulator 24 and the power amplifier 4, and controls the amplitude of the signal inputted at the power amplifier 4 in accordance with the output from the differential amplifier 15.

Figure 30:
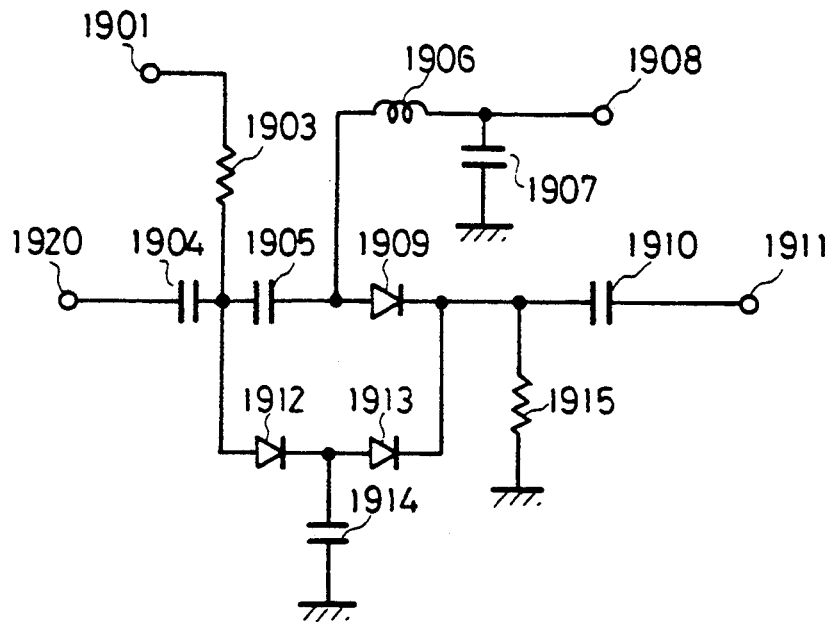
FIG. 30 is a circuit diagram to show an embodiment of the power level controller.

FIG. 30 is a circuit diagram to show an embodiment of the power level controller 19 wherein PIN diode is used.

An input 1902 is supplied with the modulated signal from the quadrature modulator 24 while the control terminal 1908 is inputted with the error signal via the DC amplifier 16. An output 1911 is connected to the power amplifier 4.

A power terminal 1901 is connected to a PIN diode 1912 via a resistor 1903. The input 1902 is connected to an anode terminal of a PIN diode 1909 via capacitors 1904, 1905 for bypassing, and the contact between the capacitors 1904 and 1905 is connected to the contact between the resistor 1903 and the PIN diode 1902. The anode terminal of the PIN diode 1909 is connected to a control terminal 1908 via a choke coil 1906, and the control terminal 1908 is grounded via a capacitor 1907 for bypassing. The cathode terminal of the PIN diode 1909 is connected to the output 1911 via the capacitor 1910, and then grounded via a resistor 1915. The cathode terminal of the PIN diode 1912 is connected to the anode terminal of a PIN diode 1913, and then grounded via a capacitor 1914.

In this circuit, resistor in radio frequency of the PIN diodes 1909, 1912 and 1913 changes by the control voltage of the control terminal 1908. The circuit becomes therefore a type resistance attenuator and attenuates the power in radio frequency.

Figure 31:
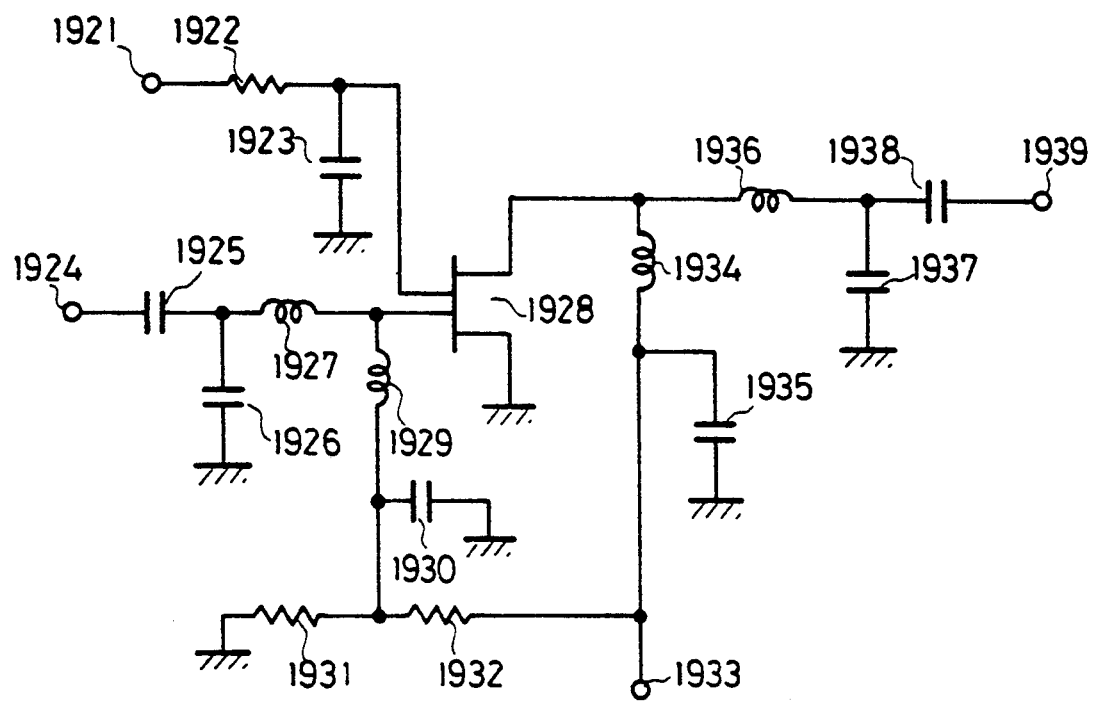
FIG. 31 is a circuit diagram to show another embodiment of the power level controller.

FIG. 31 shows in circuit diagram another embodiment of the power level controller wherein a dual gate FET is used.

A control terminal 1921 is inputted with the error signal via the DC amplifier 16. An input 1924 is supplied with the modulated signal from the quadrature modulator 24, and an output 1939 is connected to the power amplifier 4. The power terminal 1933 is supplied with the power voltage.

The control terminal 1921 is connected to one of the gate terminals of the dual gate FET 1928, and the contact between the resistor 1922 and the gate terminal is grounded via the capacitor 1923 for bypassing.

The input 1924 is connected to the other gate terminal of the dual gate FET 1928 via the capacitor 1925 for bypassing and an inductor 1927 for matching. The contact between the capacitor 1925 and the inductor 1927 is grounded via a capacitor 1930 for matching.

The voltage of the power terminal 1933 is branched out by resistors 1931 and 1932 to be supplied to the contact between the inductor 1927 and the dual gate FET 1928 via the choke coil 1929. The contact among the choke coil 1929, resistors 1931 and 1932 is grounded via the capacitor 1930 for bypassing.

The source terminal of the dual gate FET 1928 is grounded while the drain terminal is supplied with the voltage of a power terminal 1933 via a choke coil 1934. The contact between the power terminal 1933 and the choke coil 1934 is grounded via the capacitor 1935 for bypassing. The drain terminal of the dual gate FET 1928 is connected to the output 1939 via the inductor 1936 for matching and the capacitor 1938 for bypassing. The contact between the inductor 1936 and the capacitor 1938 is grounded via the capacitor 1937 for matching.

The modulated signal inputted from the input 1924 is amplified by the dual gate FET 1928. The power gain changes depending on the voltage applied at the control terminal 1921. This is because the mutual conductance of the dual gate FET 1928 changes depending on the voltage at the second gate. This fact can be utilized to realize amplitude control at high precision.

Figure 32:
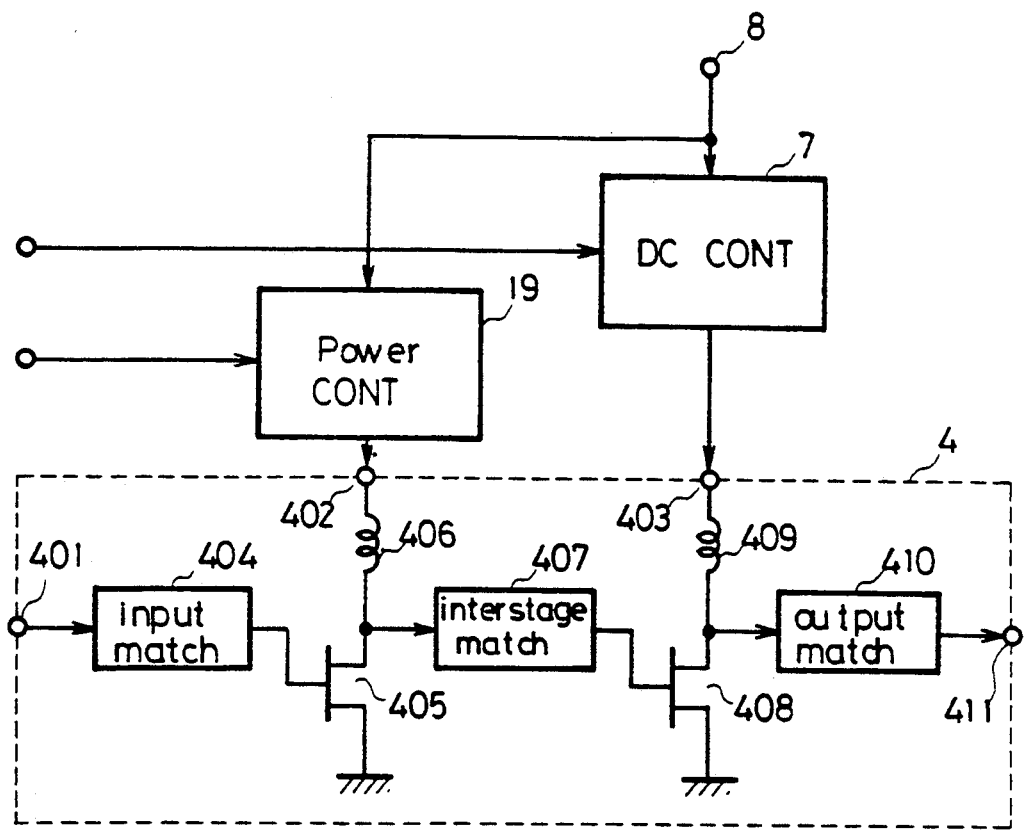
FIG. 32 is a block diagram to show essential parts of the tenth embodiment of this invention.

FIG. 32 is a block diagram to show the essential part of the tenth embodiment of this invention, wherein the power amplifier 4' having two-stage structure is used and the signal level is controlled at the first stage amplifier by the power level controller 19'.

The DC voltage controller 7 is supplied with the DC voltage from the DC power terminal 6 and with the envelope signal from the D/A converter 102. The power level controller 19' is supplied with the DC voltage from the DC power supply terminal 8 and with the error signal which has been amplified by the DC amplifier 16.

The input 401 of the power amplifier 4' is supplied with the output from the quadrature modulator 24. The bias voltage from the DC voltage controller 7 is connected to the drain bias terminal 403 of the final stage of the power amplifier 7. The output from the power level controller 19' is connected to the drain bias terminal 402 at the first stage of the power amplifier 4'.

The input 401 is connected to the gate terminal of the FET 405 via the input matching circuit 404. The drain terminal of the FET 405 is connected to the drain bias terminal 402 via the choke coil 406, and the source terminal is grounded. The drain terminal of the FET 405 is connected to the gate terminal of the FET 408 via the interstage matching circuit 407. The drain terminal of the FET 408 is connected to the drain bias terminal 403 via the choke coil 409, and the source terminal is grounded. The drain terminal of the FET 408 is connected to the output 411 for radio frequency via the output matching circuit 410.

The power level controller 19' controls the drain bias of the FET 405. This changes the power gain of the FET 405 so as to supply the signal which has been modulated with the error signal. In this way, the power amplifier 4' as a whole can compensate the amplitude at a higher precision.

Figure 33:
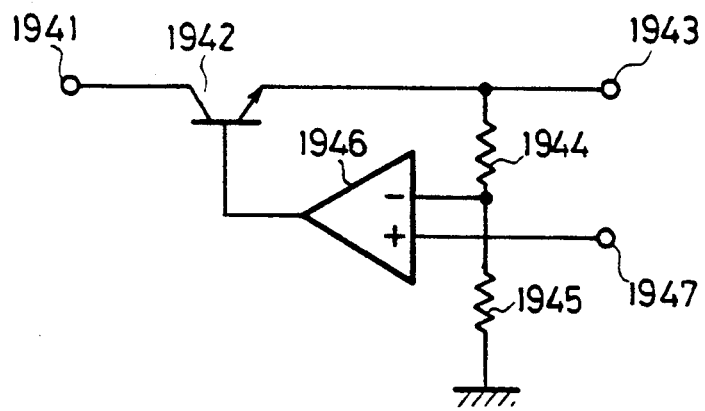
FIG. 33 is a view to show an embodiment of the power level controller to be used in the tenth embodiment.

FIG. 33 is a circuit diagram to show an embodiment of the power level controller 19' used in the tenth embodiment.

A power terminal 1941 is supplied with DC voltage from the DC power terminal 8. The power terminal 1941 is connected to an output 1943 via collector/emitter of a transistor 1942. The emitter terminal of the transistor 1942 is grounded via resistors 1944, 1945 for voltage division, the contact between the resistors 1944, 1945 is connected to the inverted input of an operational amplifier 1946. The amplified error signal is supplied at the non-inverted input of the operational amplifier 1946 via a control terminal 1947. The output of the operational amplifier 1946 is connected to the base terminal of the transistor 1942.

The transistor 1942 controls the DC voltage applied at the power terminal 1941, and supplies the voltage to the output 1943. The operational amplifier 1946 compares the divided voltage of the output 1943 with the control voltage inputted from the control terminal 1947, and supplies the difference therebetween to the base terminal of the transistor 1942. This enables a voltage of higher precision to be supplied to the output 1943. The output voltage is supplied to a drain bias terminal 402 to modulate the FET 405.

In this manner, the amplitude of the transmission system as a whole can be controlled at a higher precision by controlling in voltage the power gain of the amplifier of the transmitter.

Frequency equalization of the envelope signal to be supplied at the DC voltage controller 7, retention of the minimum bias voltage in respect of the power amplifier 4, compensation of the envelope signal with the difference thereof between the input side and the output side of the power amplifier 4, and control of the input amplitude with the difference in the envelope are applicable to analog processing of the envelope detection. Such a case is shown below.

Figure 34:
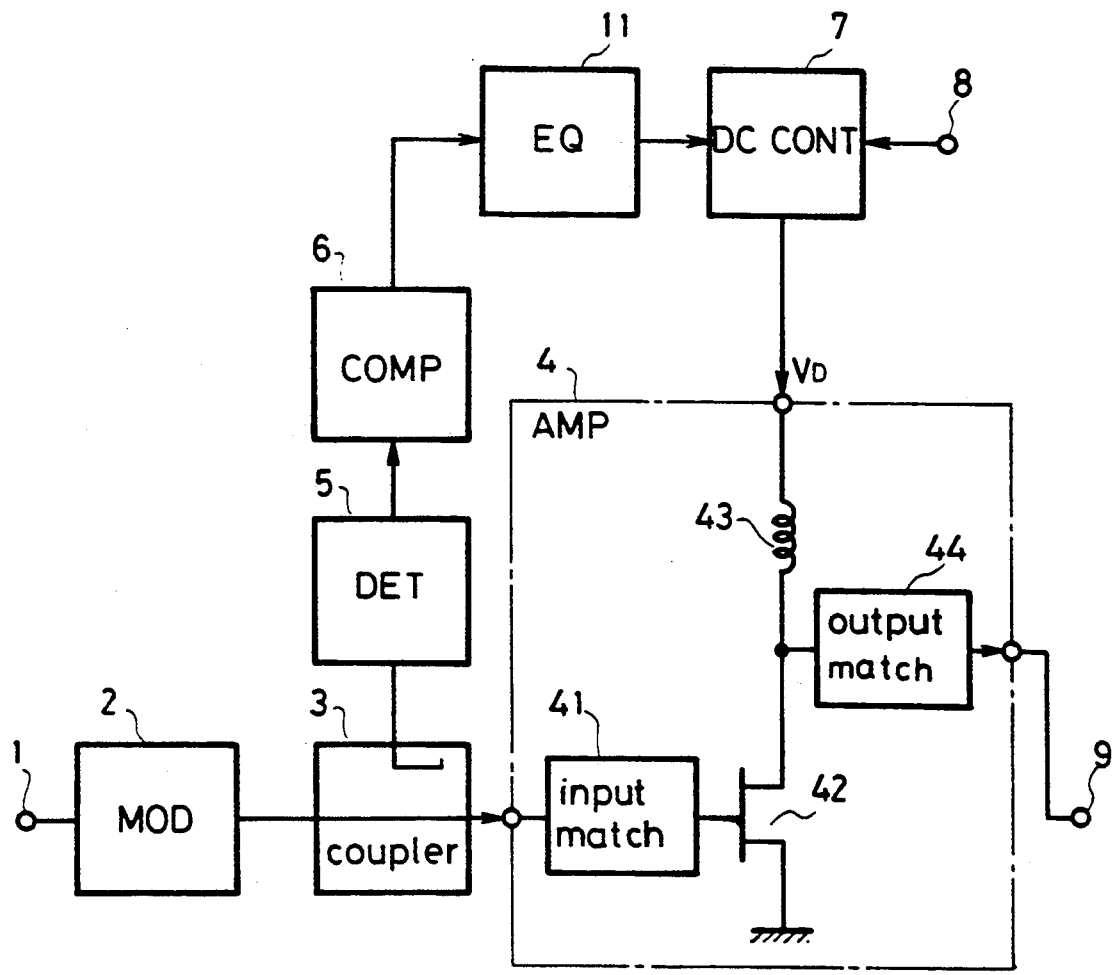
FIGS. 34 through 37 are block diagrams to show an embodiment of the linear transmitter which detects envelopes in analog, wherein respective figures show a device which equalizes the frequency, a device which holds the minimum bias voltage, a device which compensates the envelope, and a device which controls input amplitude.

FIG. 34 is a block diagram to show the linear transmitter which can equalize the frequency similarly to the fourth embodiment shown in FIG. 10.

Figure 1:
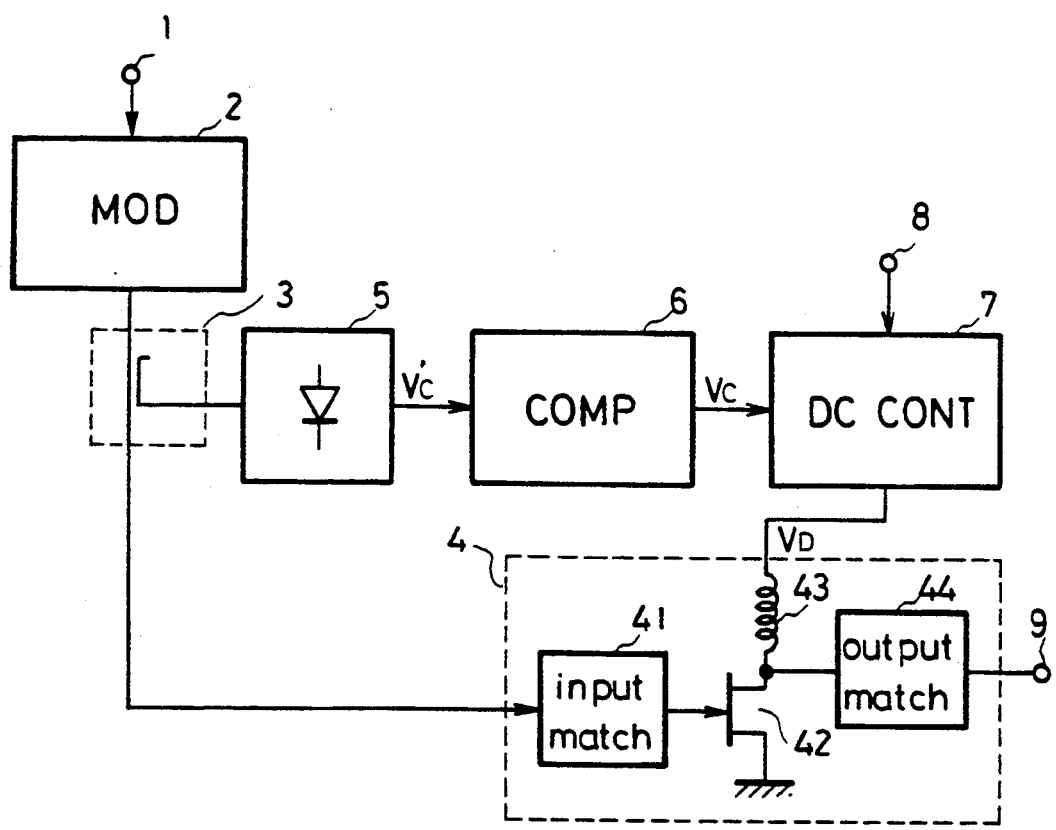
FIG. 1 is a block diagram to show a prior art transmitter.
Figure 2:
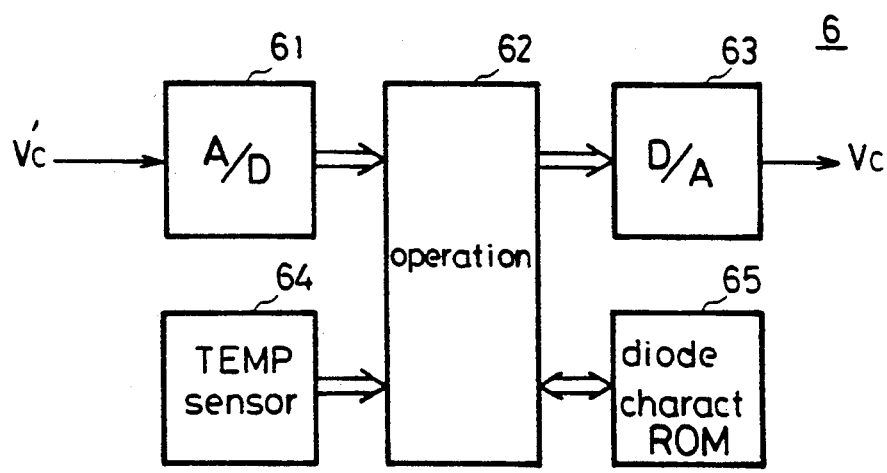
FIG. 2 is a block diagram to show an embodiment of a compensate circuitry used in the prior art transmitter.

The output from the modulator 2 is divided by the coupler 3 as in the conventional device shown in FIG. 1, detected by the envelope detector 5 and compensated by the compensate circuitry 6. The output from the circuitry 6 is supplied to the DC voltage controller 7 via the frequency equalizer 11. Therefore in this case, too, modulated signals of high speed can be amplified.

Figure 35:
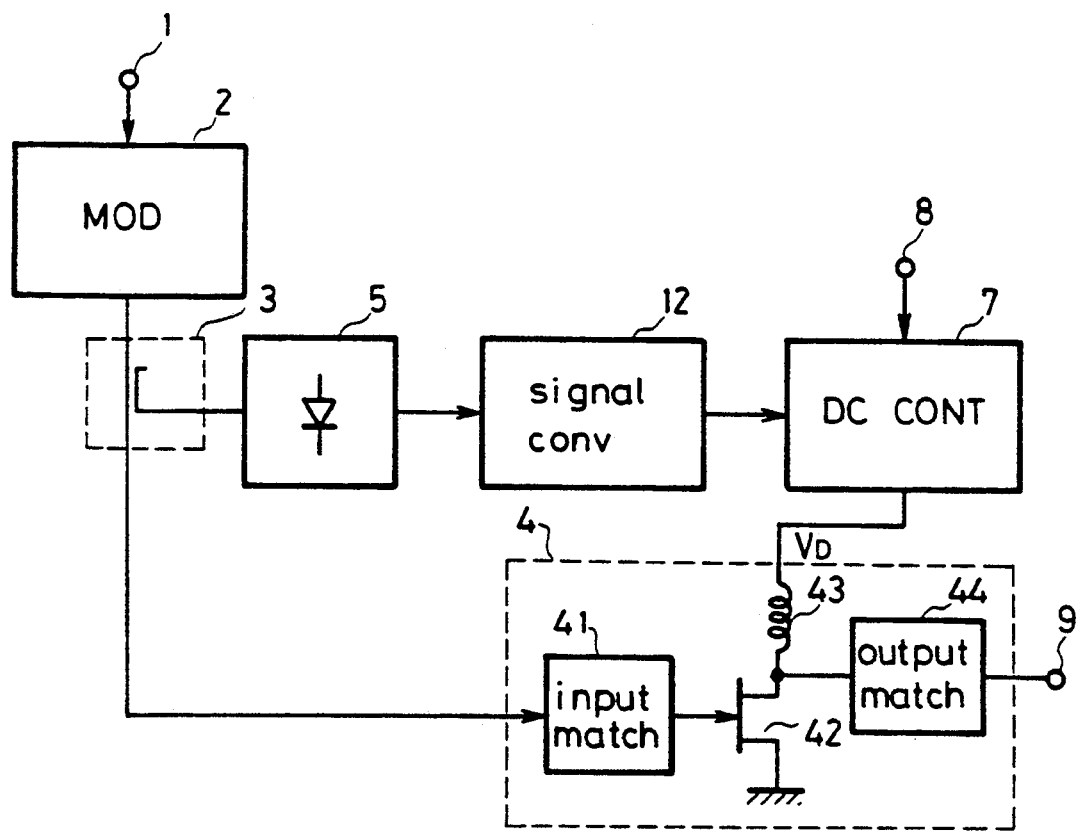

FIG. 35 is a block diagram to show a linear transmitter capable of holding the minimum bias voltage which is comparable to that in the seventh embodiment shown in FIG. 16.

For the envelope obtained by the coupler 3 and the detector 5, the signal converter 12 converts the signal as shown in FIG. 17. This can reduce the distortion in output even if the level of the envelope signal is low.

Figure 36:
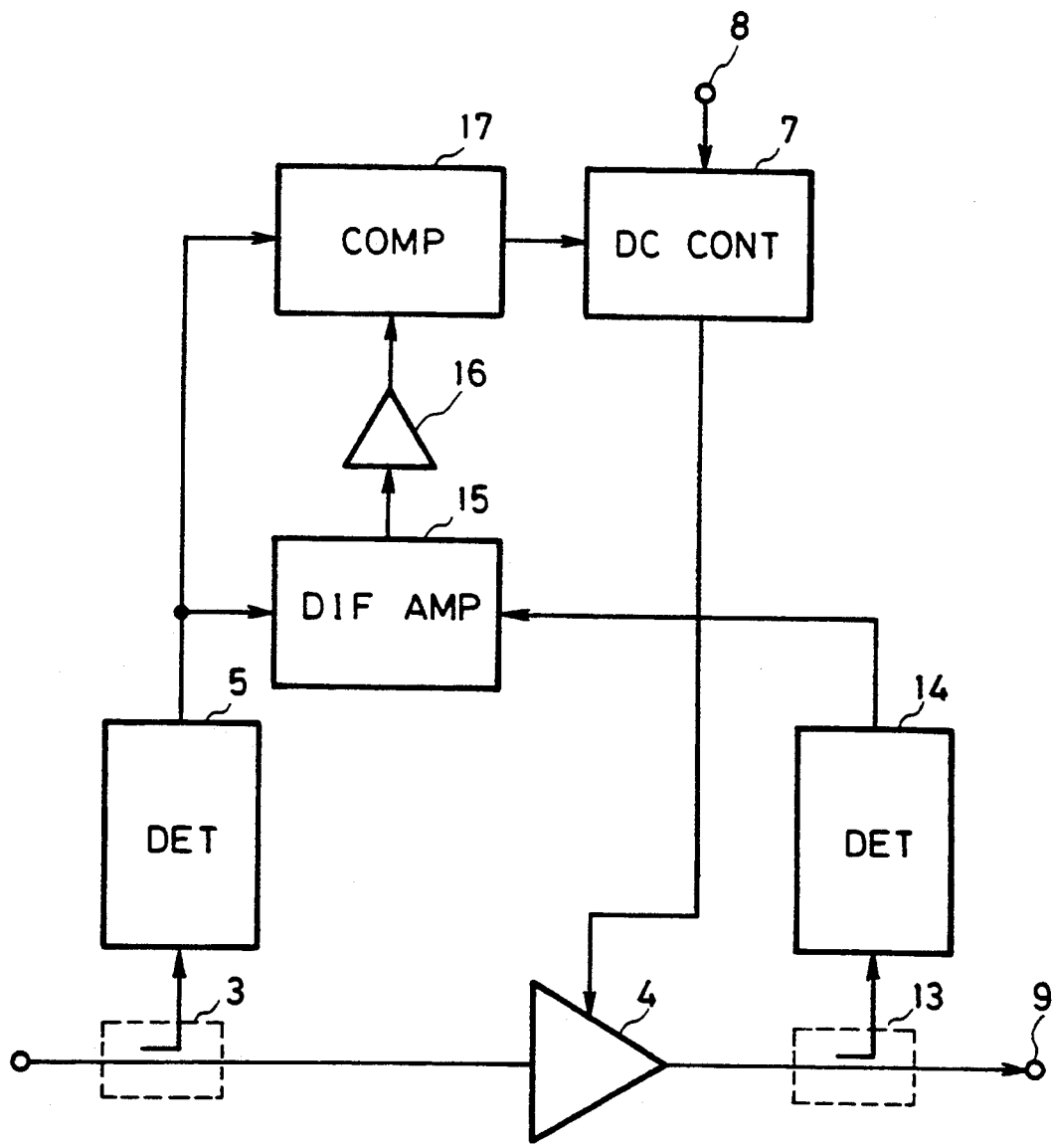

FIG. 36 is a block diagram to show a linear transmitter which compensates the envelope similarly as in the eighth embodiment in FIG. 19.

If the envelope detector 5 on the input side and the envelope detector 14 on the output side of the power amplifier 4 are of the same construction, then non-linearity of the semiconductors devices inside, if any, can be offset when error signals are generated. Therefore, signal converters like the one shown in FIG. 19 are not necessary.

Figure 37:
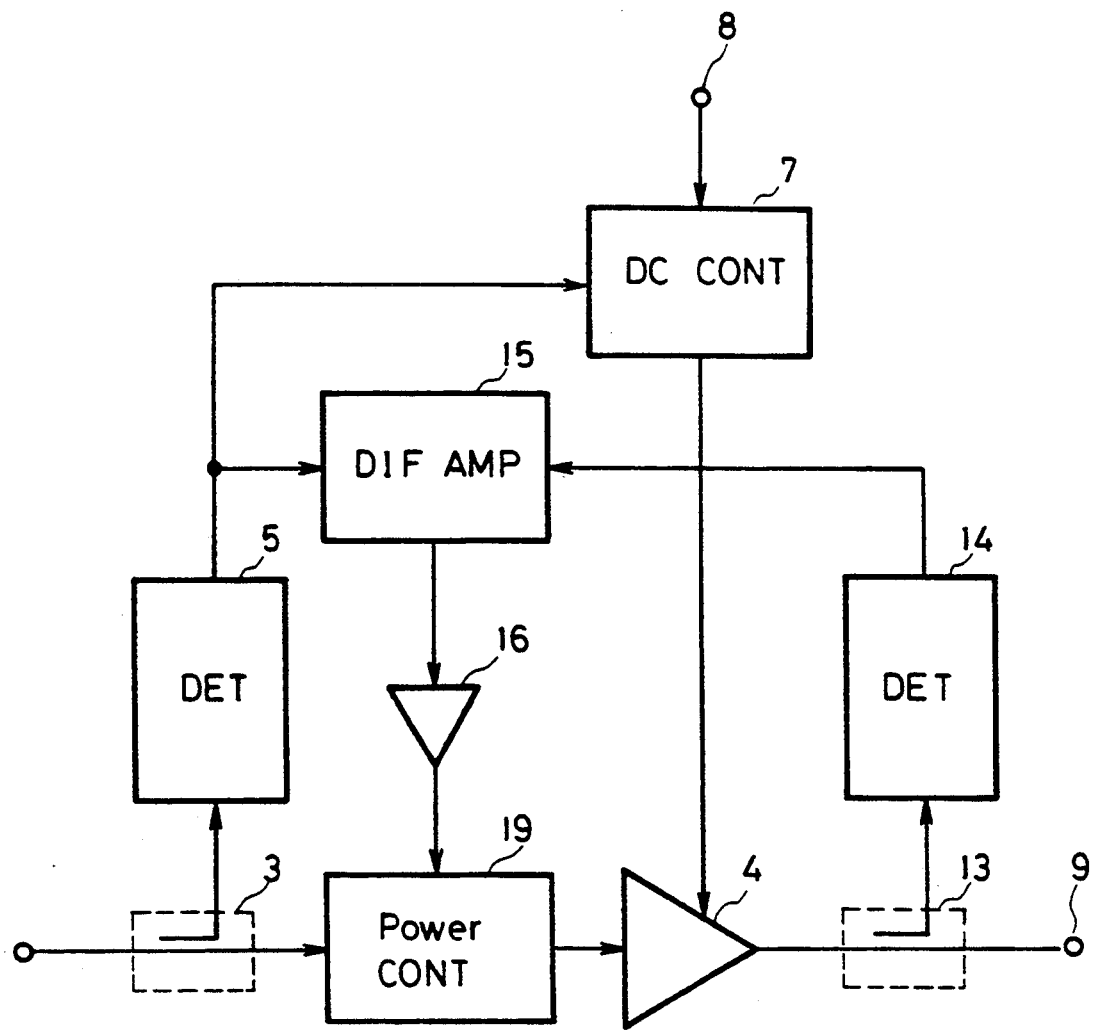

FIG. 37 is a block diagram to show a linear transmitter which controls the input amplitude similarly as in the ninth embodiment shown in FIG. 29.

If the envelope detectors 5 and 14 are of the same construction, the non-linearity can be offset without requiring a signal converter.

Figure 38:
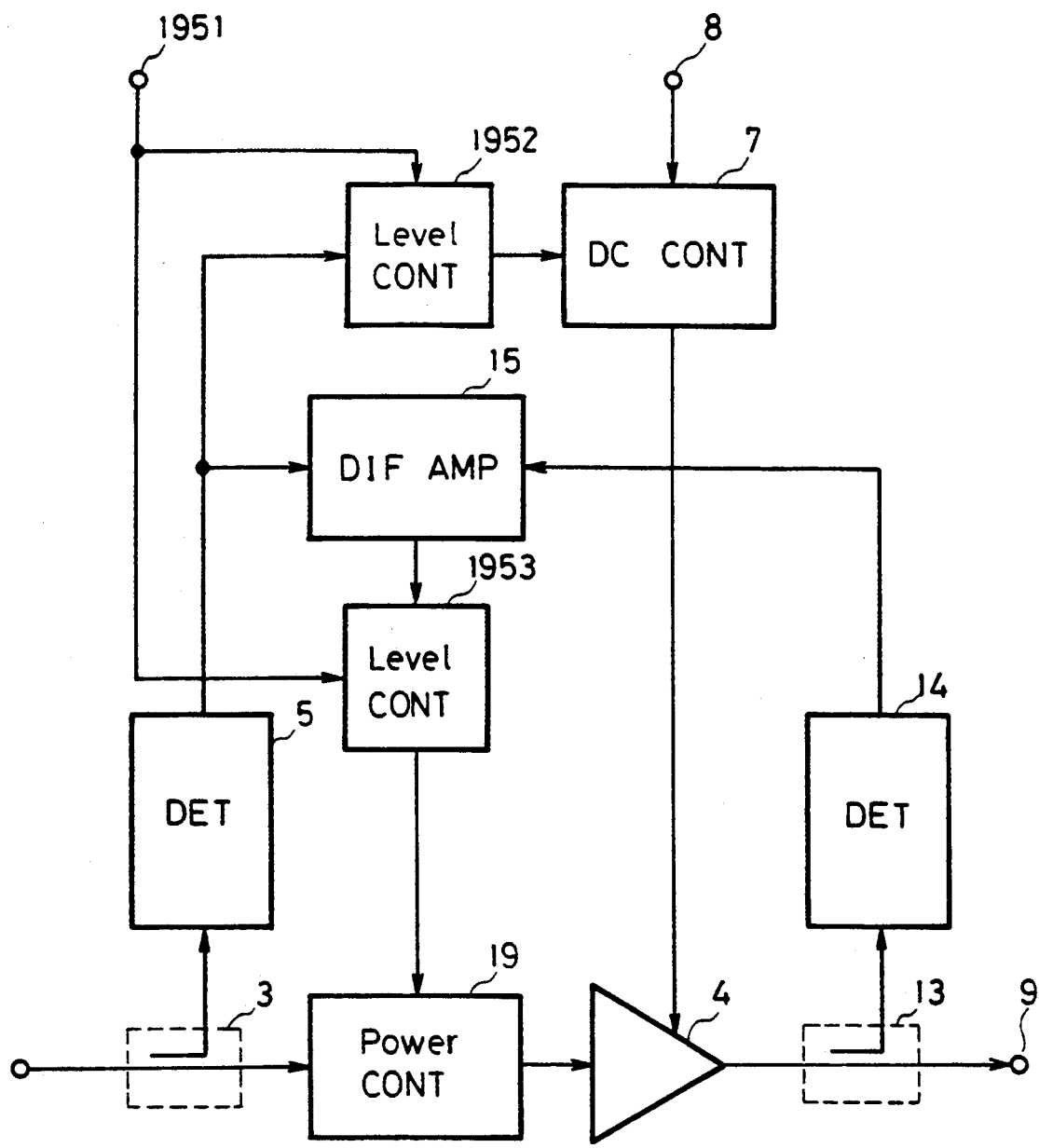
FIGS. 38 and 39 are block diagrams to show modifications of the circuit shown in FIG. 37.
Figure 39:
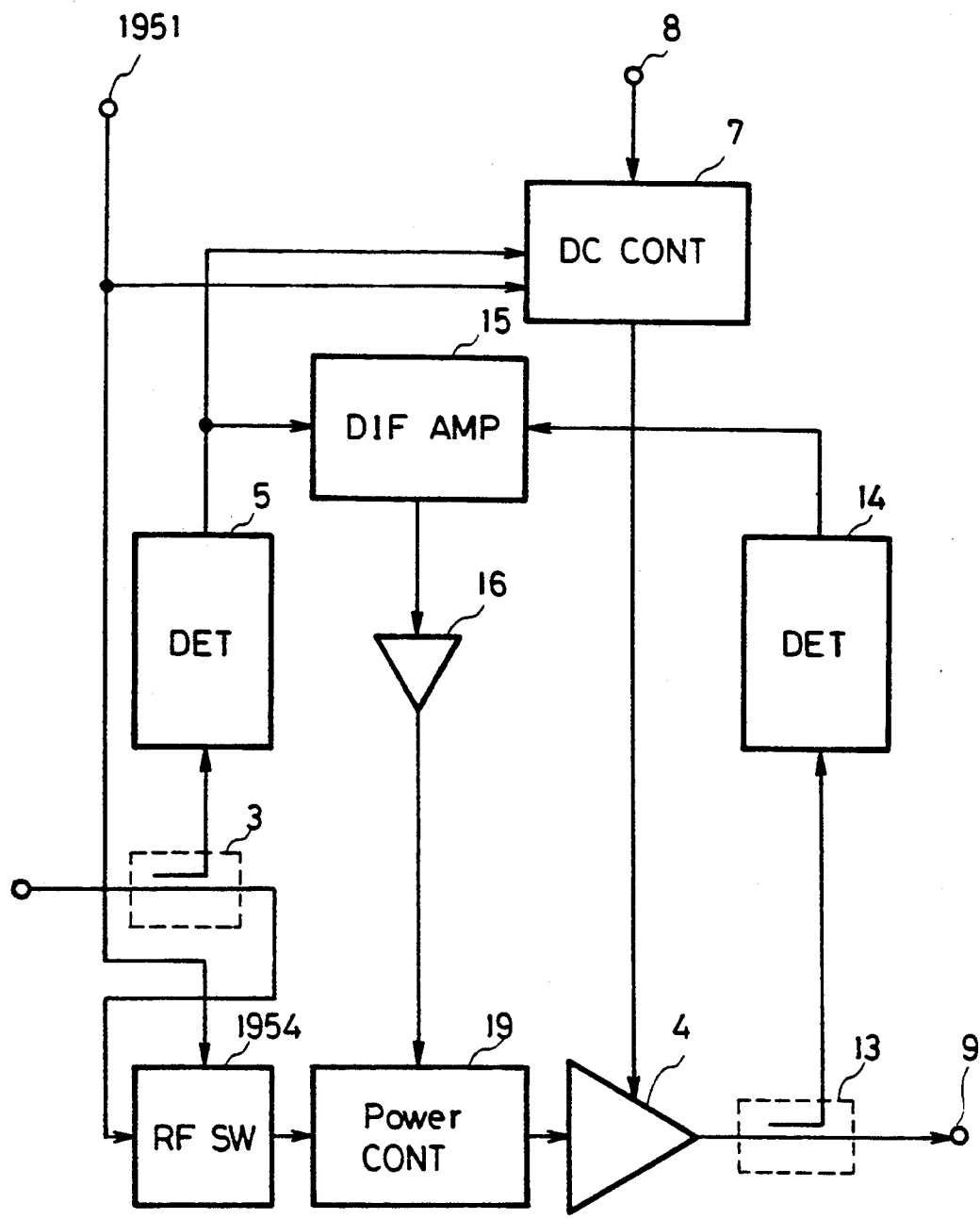

FIGS. 38 and 39 are block diagrams to show modifications of the embodiment shown in FIG. 37.

The transmitter of FIG. 38 differs from the embodiment of FIG. 37 in that a transmitter output control terminal 1951 is newly provided, and level controllers 1952, 1953 are provided between the envelope detector 5 and the DC voltage controller 7 and between the level controller 1952 and the power level controller 19 respectively.

The terminal 1951 is inputted with the control signal for the transmitter output. The controller 1952 adjusts the level of the signal inputted at the DC voltage controller 7 with the control signal. The level controller 1953 adjusts the output from the differential amplifier 15 based on the control signals to control the amount of the control by the circuit 19. This enables control of the output in transmission.

The embodiment shown in FIG. 39 comprises an RF switch 1954 so that the control signal from the control terminal 1951 is supplied to the RF switch 1954 as well as to the DC voltage controller 7. The DC voltage controller 7 suspends the bias supply to the power amplifier 4 with the control signal of the control terminal 1951. Simultaneously, the RF switch 1954 cuts the input level of the power amplifier 4 (as well as the power level controller 19). This suspends the output in transmission.

Figure 40:
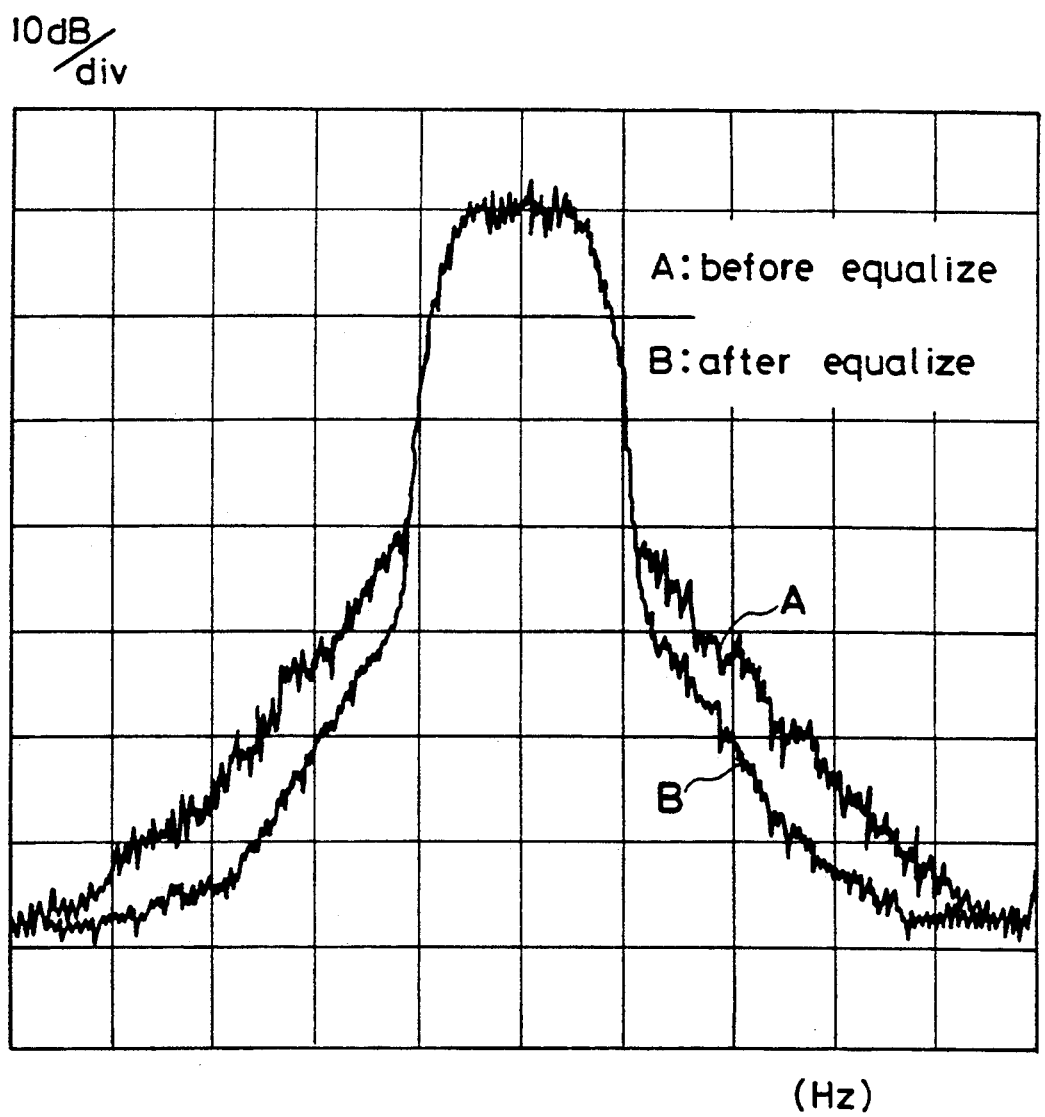
FIGS. 40 through 43 are graphs to show examples of characteristics.

FIG. 40 is a graph to show the effect of frequency equalization to indicate the output spectrum of the power amplifier 4 realized by the fourth through sixth embodiments. In this graph, the case where offset QPSK signal of 32 Kb/s is used. By equalizing in frequency the envelope signal, distortion is improved by ca. 5-10 dB.

Figure 41:
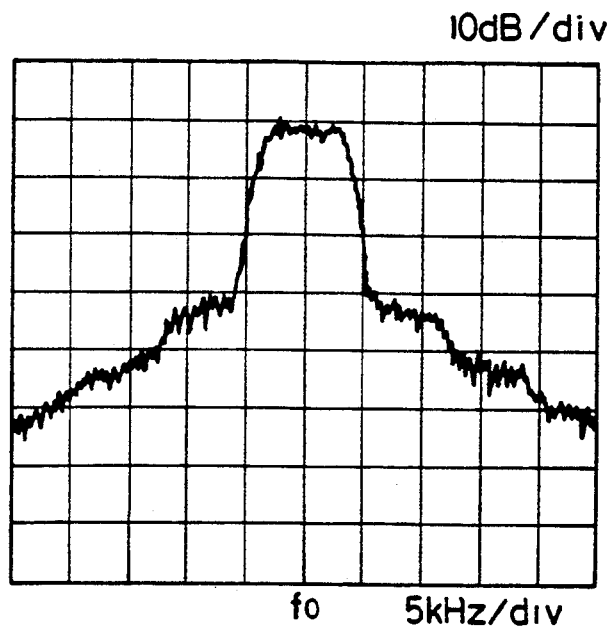
Figure 42:
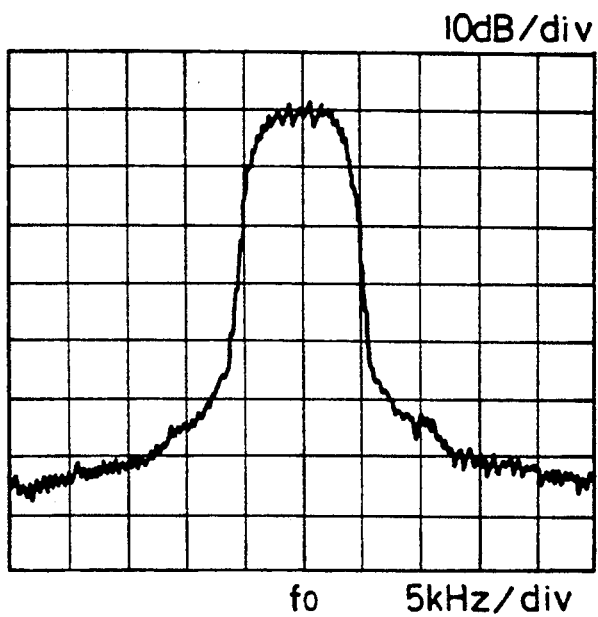

FIGS. 41 and 42 show the effect of minimum bias voltage retention indicating the output spectrum of the power amplifier 4 realized by the seventh embodiment. FIG. 41 shows the output characteristics when the signal converter 11 is removed while FIG. 42 shows the output characteristics when the signal converter 11 is included. A $\pi/4$ shift QPSK with the roll-off of 0.5 was used as the modulated signal. From the graph, it is obvious that the distortion in output was remarkably reduced by the signal conversion. In other words, by maintaining the bias voltage at a constant value or higher when the level of input envelope signal is low, the linearity of the power amplification is improved.

Figure 43:
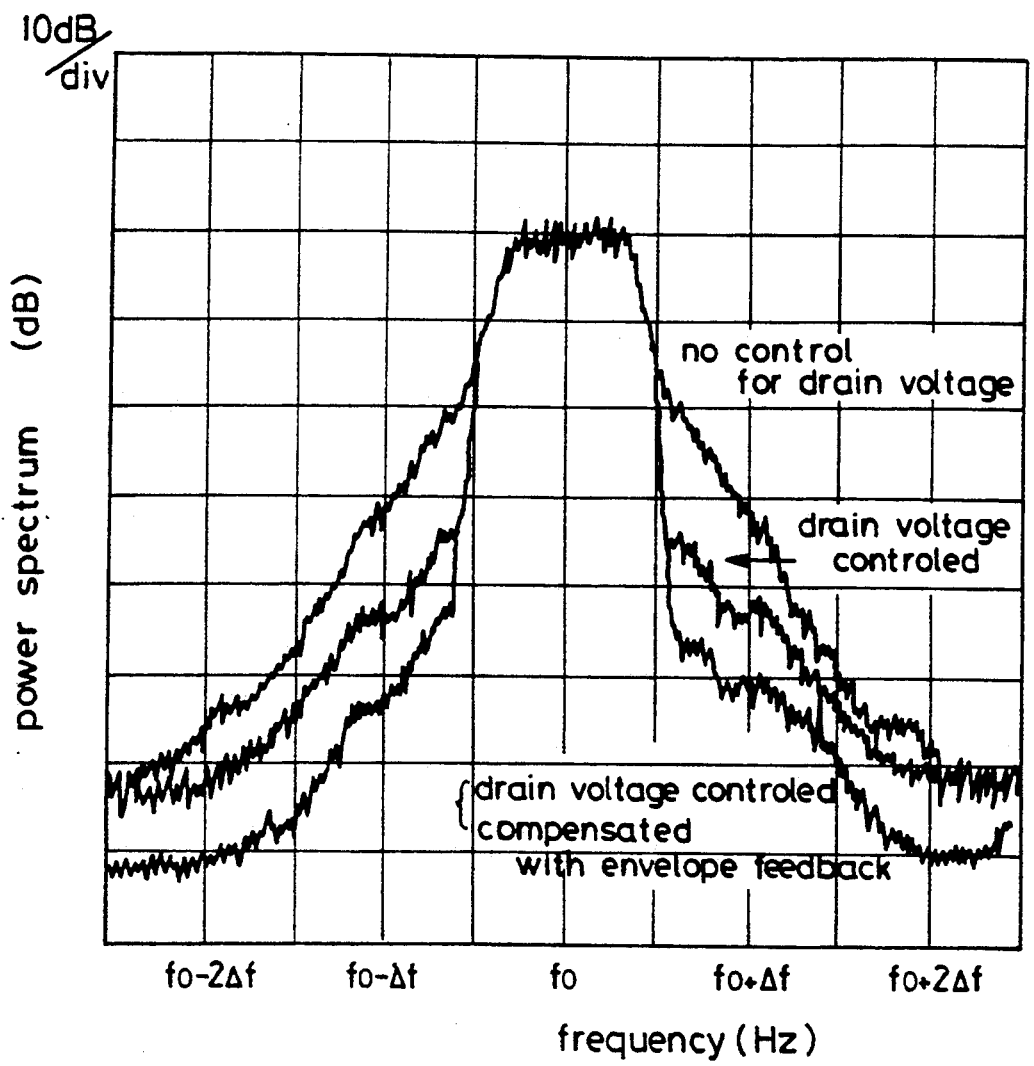

FIG. 43 is a graph to show the effect of envelope compensation indicating an example of output spectrum obtained by the eighth embodiment. In this case, offset QPSK was used as the modulation type. In the graph, the power spectrum is plotted on the vertical axis while the frequency is plotted on the horizontal axis. The power amplifier 4 is used and the outputs are measured when operated with DC voltage alone without controlling the drain voltage, when the drain voltage is controlled in accordance with the envelope on the input side, and when the drain voltage is controlled as well as feedback with the envelope on the output side is carried out. It is shown in the graph that out-of-band radiation ($f \pm \Delta f$, $f \pm 2\Delta f$) is reduced by respective compensations for distortion.

The output spectrum substantially similar to the one shown in FIG. 43 is obtained by the ninth embodiment shown in FIG. 29.

Although FETs are exemplified as the solid state amplification device in the aforementioned embodiments, this invention can be realized by using bipolar transistors with grounded emitters.

In the above description, a DC-DC converter or a series-pass regulated transistor is exemplified as the DC voltage controller 7 that controls the DC voltage with the control signal. As the DC-DC converter, a DC voltage controller which is generally known as class-S amplifier and which uses pulse amplitude modulation may be used. A step-down type DC converter or switching regulator which has the operation principle very similar to the above may be used.

APPLICABILITY IN INDUSTRY

As described in the foregoing, the linear transmitter according to this invention enables highly precise and highly stable drain control without the necessity of using envelope detector to thereby enables power amplification at high efficiency and low distortion. The transmitter may easily be made as an LSI circuit as it generates in digital the drain control signals in the base band.

It becomes possible to amplify modulated signals of higher speed by equalizing in frequency the input signals of the DC voltage controller. Simply structured circuits may be used as the frequency equalizer to realize a linear transmitter of higher speed without increasing the number of component parts.

In case the bias voltage is maintained at a constant value or higher when the level of the input envelope signal at the power amplifier is low, the linearity in power amplification when the input signal level is low can be improved.

By compensating the control signal of power voltage with the difference between the output envelope and input envelope in the power amplifier, a linear transmitter with a superior power efficiency, higher precision and stability can be realized. The linearity with respect to input modulated signals that are so high in speed that they cannot be adjusted only with the control of the power source voltage can be realized simply by modulating in amplitude the input modulated signals at the radio frequency power amplifier with the difference between the output envelope and input envelope.

This invention is effective in saving power consumption and in improving economy in the linear transmitter for radio frequency. It is particularly effective in reducing the size and saving the power consumption if applied to transmitters for broadcasting which otherwise require large power in transmission, radio system for mobile communication which is strictly restricted in power consumption and satellite communications.

What is claimed is:

1. A linear transmitter including a modulation unit which modulates an input signal in amplitude, an RF power amplifier which amplifies the modulated signal outputted from said modulation unit with a solid state amplification device with a grounded source or a grounded emitter and operating using a bias voltage, and a bias means which outputs a DC voltage substantially proportional to an envelope of said modulated signal as the bias voltage of said power amplifier, which is characterized in that said modulation unit includes a complex envelope generator which generates an in-phase envelope component and a quadrature envelope component of the modulated signal out of the input signal, a quadrature modulator which generates the modulated signal with said in-phase envelope component and quadrature envelope component, and drain voltage controlling means which obtains the envelope out of said in-phase envelope component and said quadrature envelope component and supplies the same to said bias means.

2. The linear transmitter as claimed in claim 1 wherein the drain voltage controlling means includes a numerical arithmetic processor which obtains the envelope by digital operation out of the input in-phase envelope component and quadrature envelope component.

3. The linear transmitter as claimed in claim 1 wherein the drain voltage controlling means includes a memory table which outputs values that have been written-in in advance corresponding to the input in-phase envelope component and quadrature envelope component.

4. The linear transmitter as claimed in claim 1 further comprising a delay time adjusting means is provided which makes a waveform of the modulated signal inputted at the power amplifier for radio frequency agree timewise with a wave-form of the bias voltage.

5. The linear transmitter as claimed in claim 1 further comprising a frequency equalizer which equalizes an output amplitude and phase of the drain voltage controlling means and supplies the output to the bias means.

6. The linear transmitter as claimed in claim 1 further comprising a minimum bias voltage holding means which maintains the voltage output from the bias means at a given value or higher when the signal level of the envelope output from the drain voltage controlling means is lower than a prescribed value.

7. The linear transmitter as claimed in claim 6 wherein the minimum bias voltage holding means includes a signal converter which supplies a signal of substantially constant value to the bias means when the signal level of the envelope outputted from the drain voltage controlling means is lower than a prescribed value, and supplies a signal substantially proportionate to said signal level to the bias means when said signal level is greater than said prescribed value.

8. The linear transmitter as claimed in claim 1 which further includes an output detector which obtains the envelope of the modulated signal outputted from the power amplifier for radio frequency, and an envelope compensating means which compensates the signal level of the envelope supplied to the bias means with the difference between the output from the output detecting means and the output from the drain voltage controlling means.

9. The linear transmitter as claimed in claim 1 which includes an output detecting means which obtains the envelope of the modulated signal outputted from the RF power amplifier, and an input control means which controls the amplitude of the modulated signal inputted at said power amplifier with the difference between the output from the output detecting means and the output from the drain voltage controlling means.

10. The linear transmitter as claimed in claim 1 which includes solid state amplification device in a cascade connection, and which comprises an output detecting means which obtains the envelope of the modulated signal outputted from the final stage of the cascade-connected semiconductor device, and a means which controls the bias voltage at the first or middle stage of said cascade-connected semiconductor device with the difference between the output from the output detecting means and the output from the drain voltage controlling means.

11. The linear transmitter as claimed in any of the claims 8 through 10 which includes a detector characteristic compensating means which compensates the characteristic difference between the drain voltage controlling means and the output detecting means.

12. The linear transmitter as claimed in claim 11 wherein the detector characteristic compensating means includes a means which compensates the output from the drain voltage controlling means by means of a circuit having non-linearity substantially identical to the characteristics of the output detecting means.

* * * * *